US012613605B2

(12) United States Patent
Jang et al.

(10) Patent No.: US 12,613,605 B2
(45) Date of Patent: Apr. 28, 2026

(54) DISPLAY DEVICE INCLUDING DIGITIZER WITH SENSING COILS

(71) Applicant: Samsung Display Co., Ltd., Yongin-si (KR)

(72) Inventors: Seokwon Jang, Yongin-si (KR); Hyunjae Na, Yongin-si (KR); Youngjin Lee, Yongin-si (KR); Sunhaeng Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/814,392

(22) Filed: Aug. 23, 2024

(65) Prior Publication Data

US 2025/0117102 A1 Apr. 10, 2025

(30) Foreign Application Priority Data

Oct. 6, 2023 (KR) ........................ 10-2023-0133023

(51) Int. Cl.
$G06F 3/046$ (2006.01)
$H10K 59/40$ (2023.01)
$H10K 102/00$ (2023.01)

(52) U.S. Cl.
CPC .... *G06F 3/046* (2013.01); *G06F 2203/04102* (2013.01); *H10K 59/40* (2023.02); *H10K 2102/311* (2023.02)

(58) Field of Classification Search
CPC .......... G06F 3/046; G06F 2203/04102; H10K 2102/311; H10K 59/40
See application file for complete search history.

(56) References Cited

U.S. PATENT DOCUMENTS

| | | | |
|---|---|---|---|
| 11,500,506 B2 | 11/2022 | Kishimoto et al. | |
| 2017/0205907 A1* | 7/2017 | Lim .................... | G06F 3/03545 |
| 2022/0086267 A1* | 3/2022 | Shin .................... | H04M 1/0268 |
| 2022/0404867 A1 | 12/2022 | Shin et al. | |
| 2023/0236629 A1 | 7/2023 | Kishimoto et al. | |

FOREIGN PATENT DOCUMENTS

| | | |
|---|---|---|
| KR | 10-2021-0142039 A | 11/2021 |
| KR | 10-2021-0150942 A | 12/2021 |
| KR | 10-2022-0167819 A | 12/2022 |
| KR | 10-2023-0113438 A | 7/2023 |

* cited by examiner

*Primary Examiner* — Lisa S Landis

(74) *Attorney, Agent, or Firm* — Womble Bond Dickinson (US) LLP

(57) ABSTRACT

A display device includes: a display panel including a first non-folding area, a folding area, and a second non-folding area along a first direction; and a digitizer under the display panel, and having an active area and a non-active area around the active area, the digitizer including: a first sensing coil in the active area; a second sensing coil in the active area, and overlapping with the folding area; a third sensing coil under the first sensing coil, and overlapping with the second non-folding area; and a fourth sensing coil under the third sensing coil, and overlapping with the first non-folding area. The third sensing coil and the fourth sensing coil do not overlap with each other in a plan view.

20 Claims, 13 Drawing Sheets

DISPLAY DEVICE INCLUDING DIGITIZER WITH SENSING COILS

CROSS-REFERENCE TO RELATED APPLICATION

The present application claims priority to and the benefit of Korean Patent Application No. 10-2023-0133023, filed on Oct. 6, 2023, in the Korean Intellectual Property Office, the entire disclosure of which is incorporated by reference herein.

BACKGROUND

1. Field

Aspects of embodiments of the present disclosure relate to a display device.

2. Description of the Related Art

In general, electronic devices, such as smart phones, digital cameras, laptop computers, navigation devices, and smart televisions, that provide images to a user include display devices for displaying the images. The display device generates images, and provides the images to the user through a display screen.

Recently, with the technological development of the display devices, various kinds of display devices have been developed. For example, various flexible display devices that may be deformed into a curved shape or folded or rolled have been developed. The flexible display devices may be more easily carried, and may improve the user's convenience.

The above information disclosed in this Background section is for enhancement of understanding of the background of the present disclosure, and therefore, it may contain information that does not constitute prior art.

SUMMARY

Among the flexible display devices, a folding display device may be folded about a folding axis. The folding display device may include a display module that is folded about a folding axis, and a support part disposed under the display module to support the display module. The support part may be folded together with the display module.

The folding display device may further include a digitizer disposed under the display module. The digitizer may identify a position of a pen by sensing an electromagnetic change that occurs as the pen approaches the display device.

Embodiments of the present disclosure may be directed to a display device including a digitizer that may be more easily manufactured and/or may have improved folding reliability.

According to one or more embodiments of the present disclosure, a display device includes: a display panel including a first non-folding area, a folding area, and a second non-folding area along a first direction; and a digitizer under the display panel, and having an active area and a non-active area around the active area, the digitizer including: a first sensing coil in the active area; a second sensing coil in the active area, and overlapping with the folding area; a third sensing coil under the first sensing coil, and overlapping with the second non-folding area; and a fourth sensing coil under the third sensing coil, and overlapping with the first non-folding area. The third sensing coil and the fourth sensing coil do not overlap with each other in a plan view.

In an embodiment, the second sensing coil may include: a $(2\text{-}1)^{th}$ sensing coil at the same layer as that of the first sensing coil; a $(2\text{-}2)^{th}$ sensing coil at the same layer as that of the third sensing coil; and a $(2\text{-}3)^{th}$ sensing coil at the same layer as that of the fourth sensing coil.

In an embodiment, the digitizer may further include: a main connector on the non-active area adjacent to the second non-folding area; and a sub-connector on the non-active area adjacent to the first non-folding area, and electrically connected to the main connector.

In an embodiment, the first sensing coil, the $(2\text{-}1)^{th}$ sensing coil, the $(2\text{-}2)^{th}$ sensing coil, and the third sensing coil may be connected to the main connector, and the $(2\text{-}3)^{th}$ sensing coil and the fourth sensing coil may be connected to the sub-connector.

In an embodiment, the digitizer may include a plurality of connector connection wiring lines connected to the main connector or the sub-connector. The first sensing coil, the $(2\text{-}1)^{th}$ sensing coil, the $(2\text{-}2)^{th}$ sensing coil, and the third sensing coil may be connected to the main connector through some of the connector connection wiring lines. The $(2\text{-}3)^{th}$ sensing coil and the fourth sensing coil may be connected to the sub-connector through others of the connector connection wiring lines.

In an embodiment, the $(2\text{-}1)^{th}$ sensing coil may overlap with the first non-folding area, the folding area, and the second non-folding area. The $(2\text{-}2)^{th}$ sensing coil may overlap with the folding area and the second non-folding area. The $(2\text{-}3)^{th}$ sensing coil may overlap with the folding area and the first non-folding area.

In an embodiment, the $(2\text{-}1)^{th}$ sensing coil, the $(2\text{-}2)^{th}$ sensing coil, and the $(2\text{-}3)^{th}$ sensing coil may include: a plurality of extension wiring lines extending in the first direction; and a plurality of connection wiring lines extending in a second direction crossing the first direction, and connecting the extension wiring lines to one another.

In an embodiment, the extension wiring lines and the connection wiring lines of each of the $(2\text{-}1)^{th}$ sensing coil, the $(2\text{-}2)^{th}$ sensing coil, and the $(2\text{-}3)^{th}$ sensing coil may form a loop shape.

In an embodiment, a portion of the digitizer overlapping with the folding area may have a plurality of openings, and the connection wiring lines may extend along edges of the openings.

In an embodiment, a length of the extension wiring lines may be greater than a length of the connection wiring lines.

In an embodiment, the $(2\text{-}2)^{th}$ sensing coil may overlap with the folding area and the second non-folding area.

In an embodiment, the $(2\text{-}3)^{th}$ sensing coil may overlap with the folding area and the first non-folding area.

In an embodiment, in a plan view, the $(2\text{-}1)^{th}$ sensing coil may cross the first sensing coil, the $(2\text{-}2)^{th}$ sensing coil may cross the third sensing coil, and the $(2\text{-}3)^{th}$ sensing coil may cross the fourth sensing coil.

According to one or more embodiments of the present disclosure, a display device includes: a display panel; and a digitizer under the display panel, and having a first non-folding part, a folding part, and a second non-folding part along a first direction, the digitizer including: a plurality of sensing coils; a sub-connector adjacent to the first non-folding part; and a main connector adjacent to the second non-folding part. The sensing coils are connected to any one of the sub-connector or the main connector.

In an embodiment, the digitizer may include a first layer, a second layer, and a third layer sequentially from top to bottom, the sensing coils at the first layer and the second layer may be connected to the main connector, and the sensing coils at the third layer may be connected to the sub-connector.

In an embodiment, the sensing coils may include: a first sensing coil at the first layer; a second sensing coil at the first layer, the second layer, and the third layer, and overlapping with the folding part; a third sensing coil at the second layer, and located in the second non-folding part; and a fourth sensing coil at the third layer, and located in the first non-folding part.

In an embodiment, in a plan view, the third sensing coil and the fourth sensing coil may not overlap with each other.

In an embodiment, the second sensing coil may include: a $(2\text{-}1)^{th}$ sensing coil at the first layer; a $(2\text{-}2)^{th}$ sensing coil at the second layer; and a $(2\text{-}3)^{th}$ sensing coil at the third layer. In a plan view, a portion of the $(2\text{-}2)^{th}$ sensing coil and a portion of the $(2\text{-}3)^{th}$ sensing coil may overlap with each other.

In an embodiment, the $(2\text{-}1)^{th}$ sensing coil may overlap with the first non-folding part, the folding part, and the second non-folding part. The $(2\text{-}2)^{th}$ sensing coil may overlap with the second non-folding part and the folding part, and the $(2\text{-}3)^{th}$ sensing coil may overlap with the first non-folding part and the folding part.

In an embodiment, the main connector and the sub-connector may be electrically connected to each other.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
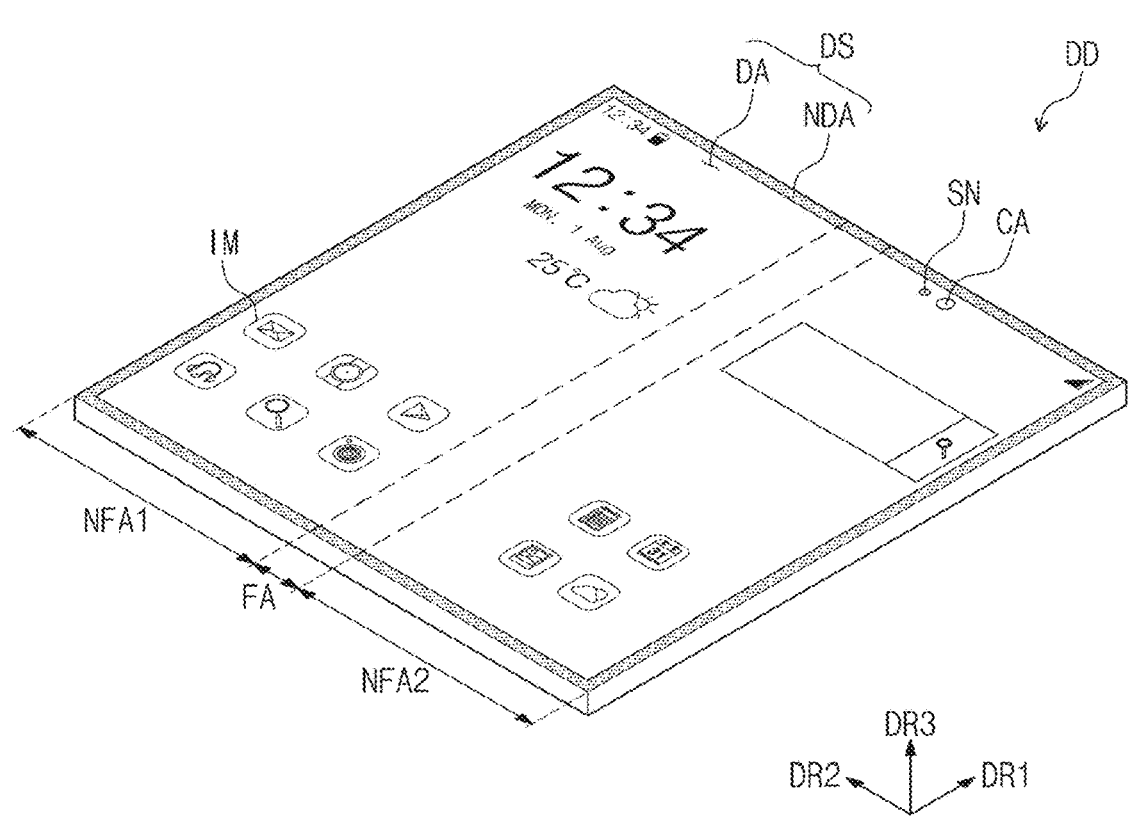
FIG. 1 is a perspective view of a display device according to an embodiment of the of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
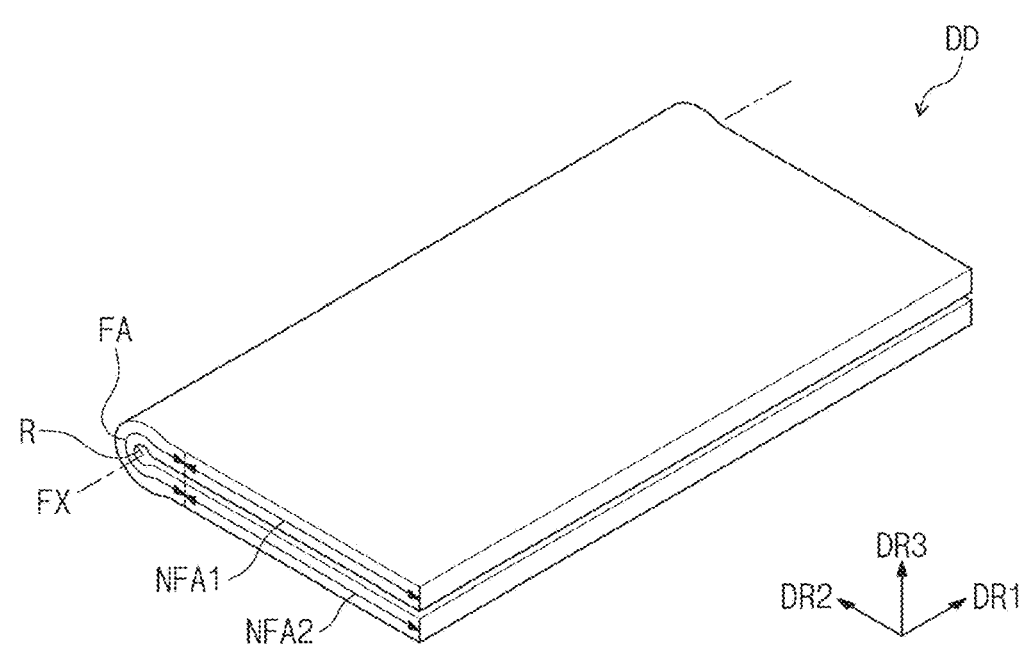
FIG. 2 is a perspective view illustrating a folded state of the display device illustrated in FIG. 1.

FIG. 1 is a perspective view of a display device according to an embodiment of the of the present disclosure. FIG. 2 is a perspective view illustrating a folded state of the display device illustrated in FIG. 1.

Referring to FIG. 1, a display device DD according to an embodiment of the present disclosure may have a rectangular shape having long sides extending in a first direction DR1, and short sides extending in a second direction DR2 crossing or intersecting the first direction DR1. However, the present disclosure is not limited thereto, and the display device DD may have various suitable shapes, such as a circular shape or various suitable polygonal shapes. The display device DD may be a flexible display device.

Hereinafter, a direction that is perpendicular to or substantially perpendicular to a plane defined by the first direction DR1 and the second direction DR2 is defined as a third direction DR3. Further, as used in the present disclosure, the phrases "when viewed on a plane" and "in a plan view" may be defined as a state when viewed from the third direction DR3.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The first non-folding area NFA1, the folding area FA, and the second non-folding area NFA2 may be arranged along the second direction DR2.

While one folding area FA and two non-folding areas NFA1 and NFA2 are illustrated in the drawings, the present disclosure is not limited thereto, and the numbers of folding areas FA and non-folding areas NFA1 and NFA2 may be variously modified as needed or desired. For example, the display device DD may include a plurality of non-folding areas of which the number is greater than two, and a plurality of folding areas arranged between the plurality of non-folding areas.

An upper surface of the display device DD may be defined as a display surface DS, and the display surface DS may have the plane defined by the first direction DR1 and the second direction DR2. Images IM generated by the display device DD may be provided to a user through the display surface DS.

The display surface DS may include a display area DA, and a non-display area NDA around (e.g., adjacent to) the display area DA. The display area DA displays an image, and the non-display area NDA may not display the image. The non-display area NDA may surround (e.g., around a periphery of) the display area DA, and may define an edge of the display device DD, which is printed in a predetermined color.

The display device DD may include at least one sensor SN and at least one camera CA. The sensor SN and the camera CA may be adjacent to an edge of the display device DD. The sensor SN and the camera CA may be arranged in the display area DA adjacent to the non-display area NDA. The sensor SN and the camera CA may be arranged in the second non-folding area NFA2, but the present disclosure is not limited thereto, and the sensor SN and the camera CA may be arranged in the first non-folding area NFA1.

Light may pass through portions of the display device DD in which the sensor SN and the camera CA are arranged, and thus, may be provided to the camera CA and the sensor SN. For example, the sensor SN may be a proximity sensor, but the type of sensor SN is not limited thereto. The camera CA may capture an external image. A plurality of sensors SN and a plurality of cameras CA may be provided.

Referring to FIG. 2, the display device DD may be a foldable display device that can be folded and/or unfolded. For example, the folding area FA may be bent about a folding axis FX parallel to or substantially parallel to the first direction DR1, and thus, the display device DD may be folded along the folding axis FX. The folding axis FX may be defined as a long axis parallel to or substantially parallel to the long sides of the display device DD.

When the display device DD is folded, the first non-folding area NFA1 and the second non-folding area NFA2 may face each other, and the display device DD may be in-folded so that the display surface DS is not exposed to the outside. However, the present disclosure is not limited thereto. For example, the display device DD may be out-folded about the folding axis FX so that the display surface DS is exposed to the outside.

A distance between the first non-folding area NFA1 and the second non-folding area NFA2 may be smaller than twice a radius "R" of curvature (e.g., a diameter). In this case, the folding area FA may be folded in a dumbbell shape.

Figure 3:
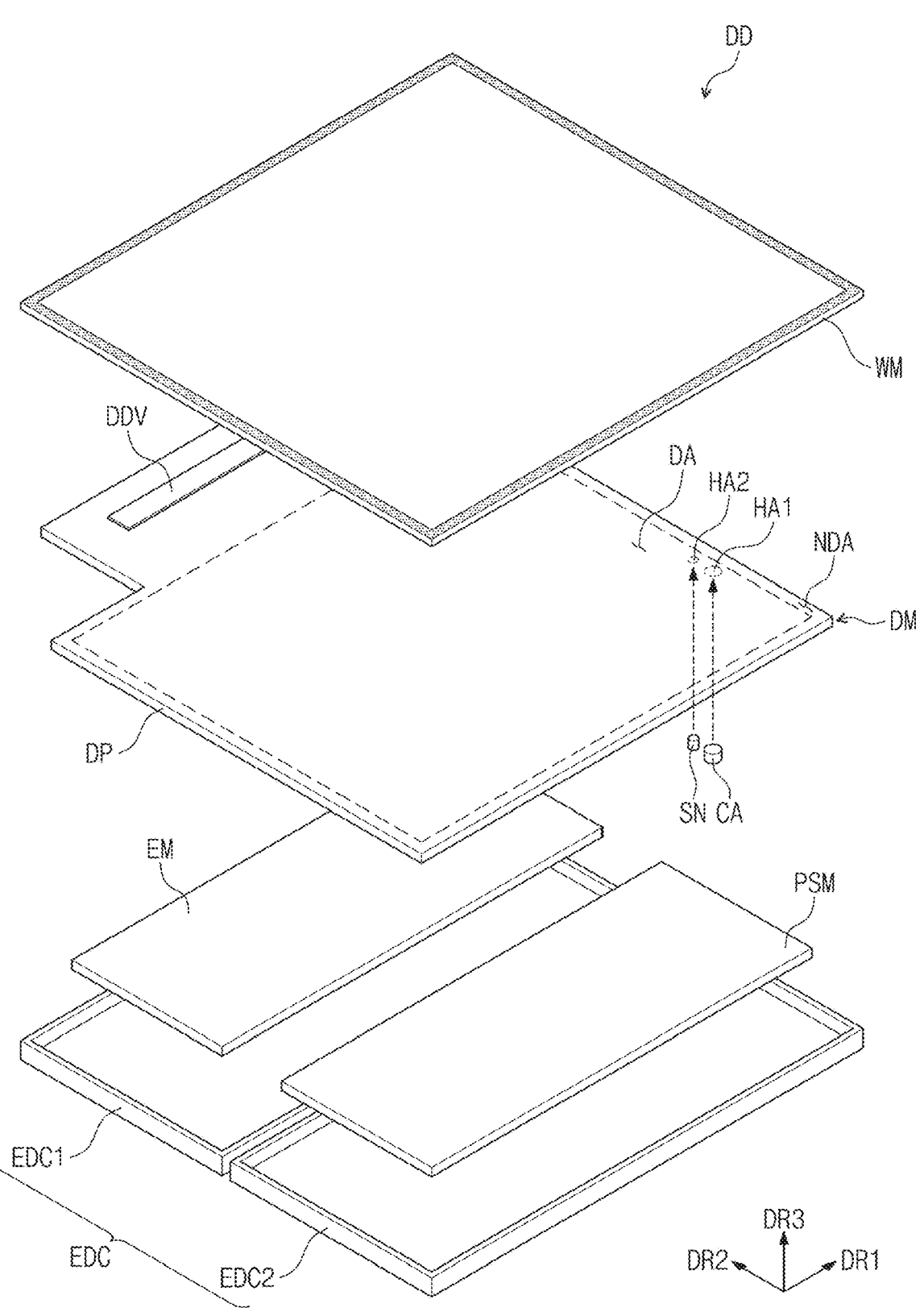
FIG. 3 is an exploded perspective view of the display device illustrated in FIG. 1.

FIG. 3 is an exploded perspective view of the display device illustrated in FIG. 1.

Referring to FIG. 3, the display device DD may include a window module (e.g., a window) WM, a display module (e.g., a display or a touch-display) DM, the camera CA, the sensor SN, an electronic module (e.g., an electronic device or circuit) EM, a power supply module (e.g., a power supply) PSM, and a case EDC. In some embodiments, the display device DD may further include a mechanical structure (e.g., a hinge) for controlling a folding operation of the display module DM.

The display module DM may generate an image, and sense an external input. The window module WM may define a front surface of the display device DD. The window module WM may be disposed on the display module DM to protect the display module DM. The window module WM may transmit the light generated by the display module DM to provide the transmitted light to the user.

The display module DM may include a display panel DP. Although FIG. 3 illustrates the display panel DP from among a laminated structure of the display module DM, the display module DM may further include a plurality of components arranged on an upper side and a lower side of the display panel DP. A detailed laminated structure of the display module DM will be described in more detail below. The display panel DP includes a display area DA and a non-display area NDA corresponding to the display area DA (e.g., see FIG. 1) and the non-display area NDA of the display device DD.

A first hole area HA1 and a second hole area HA2 may be defined in the display panel DP. The first hole area HA1 and the second hole area HA2 may have higher light transmittance than that of a peripheral area. The camera CA may be disposed under the first hole area HA1, and the sensor SN may be disposed under the second hole area HA2. The light passing through the first and second hole areas HA1 and HA2 may be provided to the camera CA and the sensor SN.

The display module DM may include a data driver DDV disposed on the non-display area NDA of the display panel DP. The data driver DDV may be manufactured in the form of an integrated circuit chip, and mounted on the non-display area NDA. However, the present disclosure is not limited thereto, and the data driver DDV may be disposed on a flexible circuit board connected to the display panel DP.

The electronic module EM and the power supply module PSM may be arranged under the display module DM. The electronic module EM and the power supply module PSM may be connected to each other through a separate flexible circuit board. The electronic module EM may control an operation of the display module DM. The power supply module PSM may supply power to the display module DM.

The case EDC may accommodate the window module WM, the display module DM, the electronic module EM, and the power supply module PSM. The case EDC may include first and second cases EDC1 and EDC2 to fold the display module DM. The first and second cases EDC1 and EDC2 may extend in the first direction DR1, and arranged along the second direction DR2.

The display device DD may further include a hinge structure for connecting the first case EDC1 and the second case EDC2 to each other. The case EDC may be connected to (e.g., attached to or coupled to) the window module WM.

The case EDC may protect the window module WM, the display module DM, the electronic module EM, and the power supply module PSM.

Figure 4:
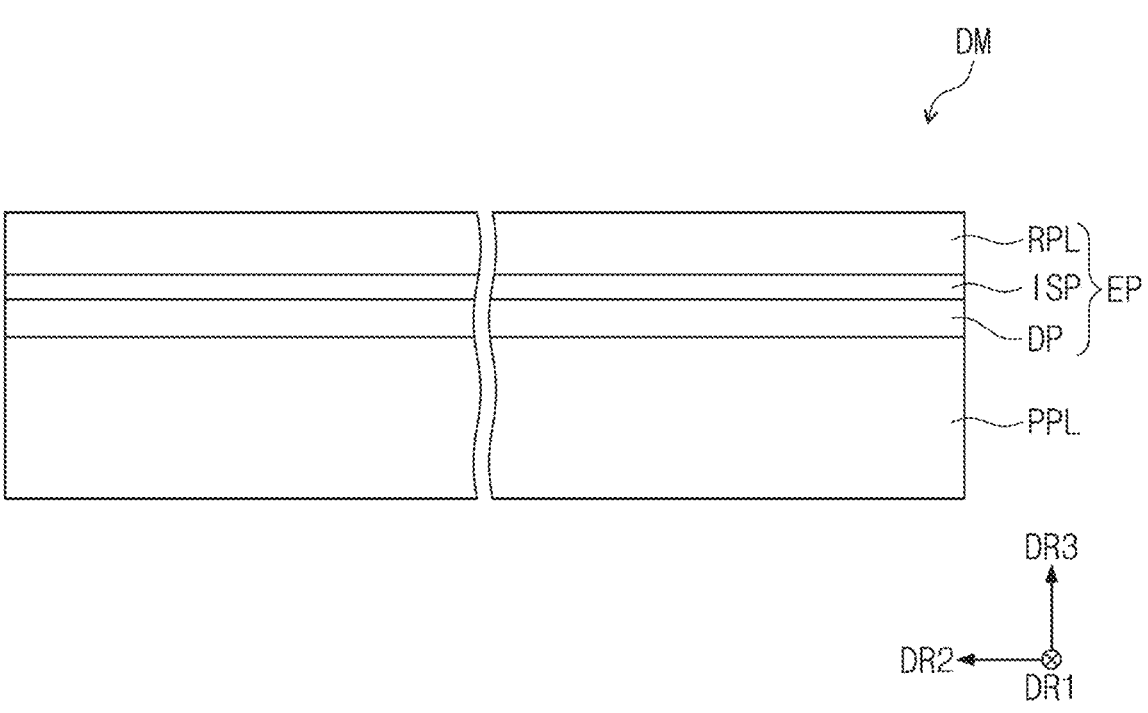
FIG. 4 is a schematic cross-sectional view of a display module illustrated in FIG. 3.

FIG. 4 is a schematic cross-sectional view of a display module illustrated in FIG. 3.

Referring to FIG. 4, the display module DM may include an electronic panel EP, and a panel protecting layer PPL disposed under the electronic panel EP. The electronic panel EP may include the display panel DP, an input sensing unit (e.g., an input sensing layer or panel) ISP disposed on the display panel DP, and a reflection preventing layer RPL disposed on the input sensing unit ISP. The display panel DP may be a flexible panel. For example, the display panel DP may include a flexible substrate, and a plurality of elements arranged on the flexible substrate.

The display panel DP according to an embodiment of the present disclosure may be a light emitting display panel, but the present disclosure is not limited thereto. For example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod, and the like. Hereinafter, the display panel DP will be described in more detail in the context of the organic light emitting display panel as a representative example.

The input sensing unit ISP may include a plurality of sensor units (e.g., a plurality of sensors) for sensing an external input in a capacitive manner. The input sensing unit ISP may be directly formed on the display panel DP when the display module DM is manufactured.

The reflection preventing layer RPL may be disposed on the input sensing unit ISP. The reflection preventing layer RPL may be directly formed on the input sensing unit ISP when the display module DM is manufactured. The reflection preventing layer RPL may be defined as an external light reflection preventing film. The reflection preventing layer RPL may reduce a reflectance of external light input from an upper side of the display device DD toward the display panel DP.

As an example, the input sensing unit ISP may be directly formed on the display panel DP, and the reflection preventing layer RPL may be directly formed on the input sensing unit ISP, but the present disclosure is not limited thereto. For example, the input sensing unit ISP may be separately manufactured from and attached to the display panel DP by an adhesive layer, and the reflection preventing layer RPL may be separately manufactured from and attached to the input sensing unit ISP by an adhesive layer.

The panel protecting layer PPL may be disposed under the display panel DP. The panel protecting layer PPL may protect a lower portion of the display panel DP. The panel protecting layer PPL may include a flexible plastic material. For example, the panel protecting layer PPL may include polyethylene terephthalate (PET).

Figure 5:
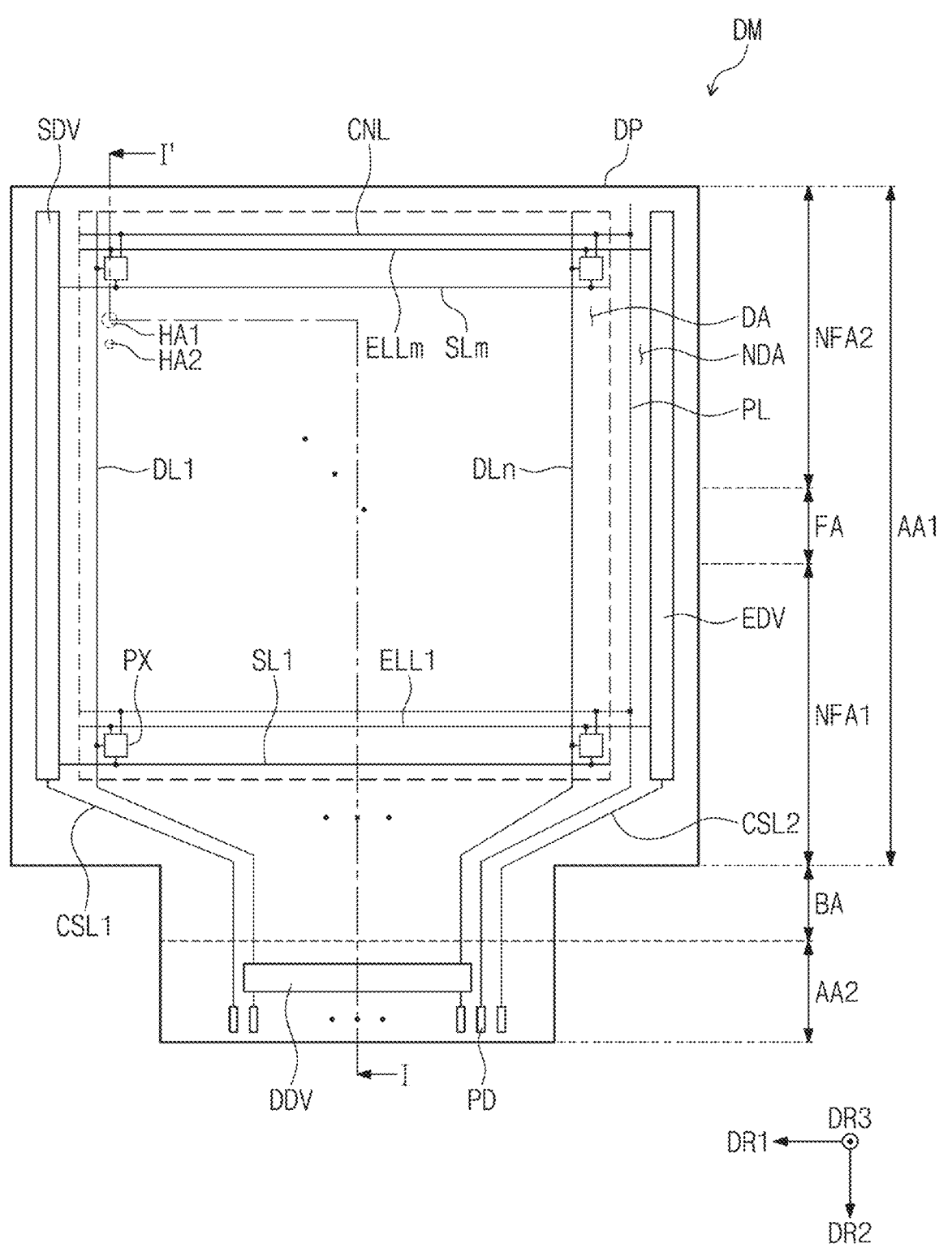
FIG. 5 is a plan view of a display panel illustrated in FIG. 3.

FIG. 5 is a plan view of a display panel illustrated in FIG. 3.

Referring to FIG. 5, the display module DM may include the display panel DP, a scan driver SDV, the data driver DDV, and an emission driver EDV.

The display panel DP may include a first area AA1, a second area AA2, and a bending area BA between the first area AA1 and the second area AA2. The bending area BA may extend in the first direction DR1, and the first area AA1, the bending area BA, and the second area AA2 may be arranged along the second direction DR2.

The first area AA1 may include the display area DA, and the non-display area NDA around (e.g., adjacent to) the display area DA. The non-display area NDA may surround (e.g., around a periphery of) the display area DA. The display area DA may be an area that displays an image, and the non-display area NDA may be an area that does not display an image. The second area AA2 and the bending area BA may be areas that do not display images.

When viewed in the first direction DR1, the first area AA1 may include the first non-folding area NFA1, the second non-folding area NFA2, and the folding area FA between the first non-folding area NFA1 and the second non-folding area NFA2. The first and second hole areas HA1 and HA2 may be defined in the display area DA and the second non-folding area NFA2.

The display panel DP may include a plurality of pixels PX, a plurality of scan lines SL1 to SLm, a plurality of data lines DL1 to DLn, a plurality of light emitting lines ELL1 to ELLm, first and second control lines CSL1 and CSL2, a power line PL, a plurality of connection lines CNL, and the plurality of pads PD, where "m" and "n" are natural numbers. The pixels PX may be arranged in the display area DA, and may be connected to the scan lines SL1 to SLm, the data lines DL1 to DLn, and the light emitting lines ELL1 to ELLm.

The scan driver SDV and the emission driver EDV may be arranged in the non-display area NDA. The scan driver SDV and the emission driver EDV may be arranged in the non-display area NDA adjacent to both sides of the first area AA1, which are opposite to each other in the first direction DR1. The data driver DDV may be disposed in the second area AA2. The data driver DDV may be manufactured in the form of an integrated circuit chip, and mounted on the second area AA2.

The scan lines SL1 to SLm may extend in the first direction DR1, and may be connected to the scan driver SDV. The data lines DL1 to DLn may extend in the second direction DR2, and may be connected to the data driver DDV via the bending area BA. The light emitting lines ELL1 to ELLm may extend in the first direction DR1, and may be connected to the emission driver EDV.

The power line PL may extend in the second direction DR2, and may be disposed in the non-display area NDA. The power line PL may be disposed between the display area DA and the emission driver EDV, but the present disclosure is not limited thereto, and the power line PL may be disposed between the display area DA and the scan driver SDV.

The power line PL may extend to the second area AA2 via the bending area BA. The power line PL may extend toward a lower end of the second area AA2 when viewed on a plane (e.g., in a plan view). The power line PL may receive a driving voltage.

The connection lines CNL may extend in the first direction DR1, and may be arranged along the second direction DR2. The connection lines CNL may be connected to the power line PL and the pixels PX. The driving voltage may be applied to the pixels PX through the power line PL and the connection lines CNL connected to each other.

The first control line CSL1 may be connected to the scan driver SDV, and may extend toward the lower end of the second area AA2 via the bending area BA. The second control line CSL2 may be connected to the emission driver EDV, and may extend toward the lower end of the second area AA2 via the bending area BA. The data driver DDV may be disposed between the first control line CSL1 and the second control line CSL2.

When viewed on a plane (e.g., in a plan view), the pads PD may be arranged to be adjacent to the lower end of the second area AA2. The data driver DDV, the power line PL, the first control line CSL1, and the second control line CSL2 may be connected to the pads PD.

The data lines DL1 to DLn may be connected to corresponding pads PD through the data driver DDV. For example, the data lines DL1 to DLn may be connected to the data driver DDV, and the data driver DDV may be connected to the pads PD corresponding to the data lines DL1 to DLn, respectively.

A printed circuit board may be connected to the pads PD, and a timing controller and a voltage generator may be arranged on the printed circuit board. The timing controller may be manufactured as an integrated circuit chip, and mounted on the printed circuit board. The timing controller and the voltage generator may be connected to the pads PD through the printed circuit board.

The timing controller may control operations of the scan driver SDV, the data driver DDV, and the emission driver EDV. The timing controller may generate a scan control signal, a data control signal, and a light emitting control signal in response to control signals received from an external unit (e.g., an external device). The voltage generator may generate the driving voltage.

The scan control signal may be provided to the scan driver SDV through the first control line CSL1. The light emitting control signal may be provided to the emission driver EDV through the second control line CSL2. The data control signal may be provided to the data driver DDV. The timing controller may receive image signals from an external unit (e.g., an external device), convert data formats of the image signals to satisfy interface specifications with the data driver DDV, and provide the converted image signals to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding to the image signals in response to the data control signal. The data voltages may be applied to the pixels PX through the data lines DL1 to DLn. The emission driver EDV may generate a plurality of light emitting signals in response to the light emitting control signal. The light emitting signals may be applied to the pixels PX through the light emitting lines ELL1 to ELLm.

The pixels PX may receive the data voltages in response to the scan signals. The pixels PX may display an image by emitting light having luminances corresponding to the data voltages in response to the light emitting signals. Light emitting times of the pixels PX may be controlled by the light emitting signals.

Figure 6:
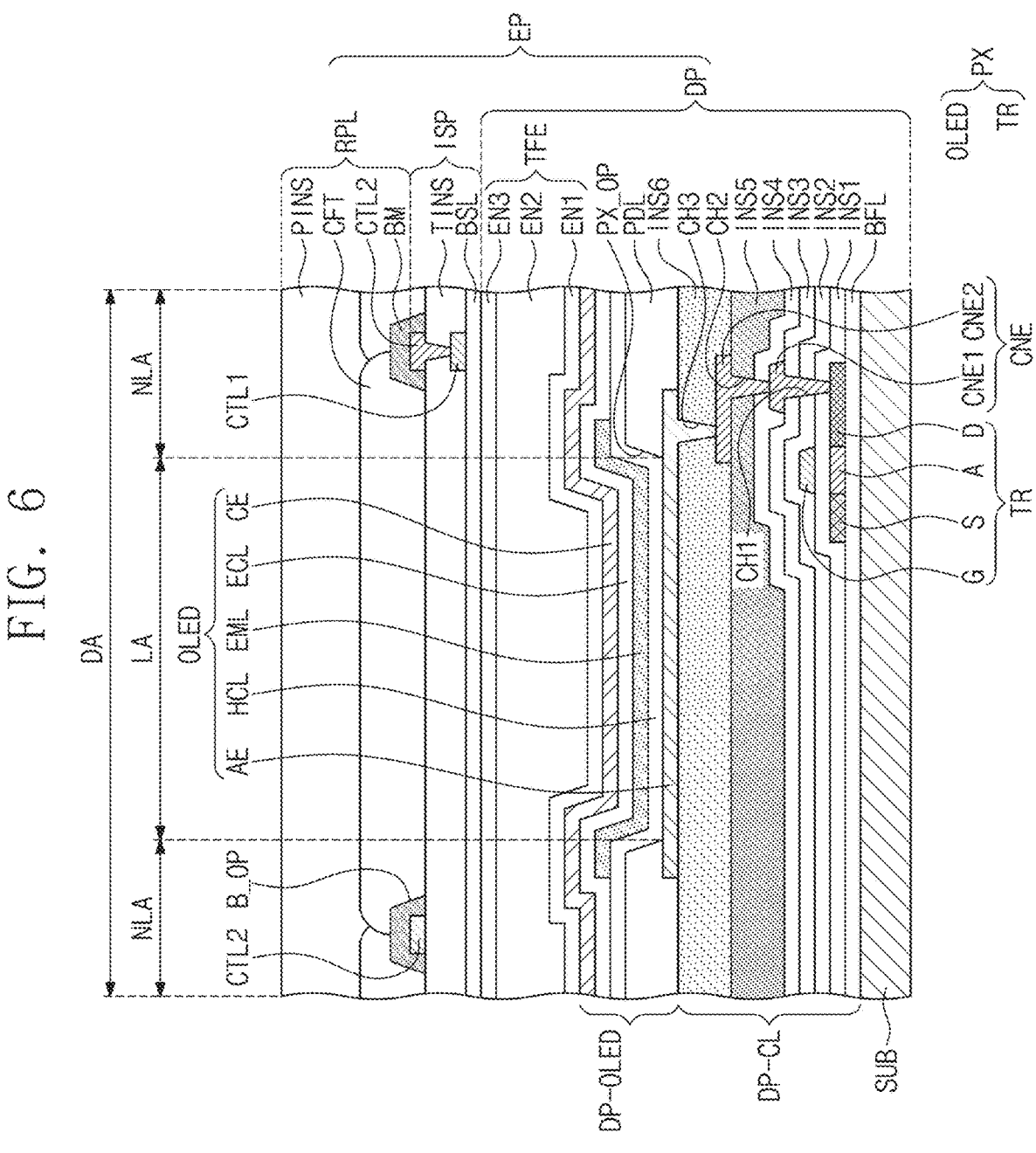
FIG. 6 is a view illustrating a cross section of an electronic panel corresponding to one pixel illustrated in FIG. 5.

FIG. 6 is a view illustrating a cross section of an electronic panel corresponding to one pixel illustrated in FIG. 5.

Referring to FIG. 6, the pixel PX may include a transistor TR and a light emitting element OLED. The light emitting element OLED may include a first electrode AE (e.g., an anode), a second electrode CE (e.g., a cathode), a hole control layer HCL, an electron control layer ECL, and a light emitting layer EML.

The transistor TR and the light emitting element OLED may be arranged on a substrate SUB. Although one transistor TR is illustrated, the pixel PX may include a plurality of transistors and at least one capacitor for driving the light emitting element OLED.

The display area DA may include a light emitting area LA for each of the pixels PX, and a non-light emitting area NLA around (e.g., adjacent to) the light emitting area LA. The light emitting element OLED may be disposed in the light emitting area LA.

A buffer layer BFL may be disposed on the substrate SUB, and the buffer layer BFL may be an inorganic layer. A semiconductor pattern may be disposed on the buffer layer BFL. The semiconductor pattern may include polysilicon, amorphous silicon, or a metal oxide.

The semiconductor pattern may be doped with an N-type dopant or a P-type dopant. The semiconductor pattern may include a high-doped area and a low-doped area. Conductivity of the high-doped area is higher than conductivity of the low-doped area, and the high-doped area may serve or substantially serve as a source electrode and/or a drain electrode of the transistor TR. The low-doped area may correspond to or substantially correspond to an active (e.g., a channel) of the transistor TR.

A source "S," an active "A," and a drain "D" of the transistor TR may be formed from the semiconductor pattern. A first insulating layer INS1 may be disposed on the semiconductor pattern. A gate "G" of the transistor TR may be disposed on the first insulating layer INS1. A second insulating layer INS2 may be disposed on the gate "G". A third insulating layer INS3 may be disposed on the second insulating layer INS2.

A connection electrode CNE may include a first connection electrode CNE1 and a second connection electrode CNE2 to connect the transistor TR and the light emitting element OLED to each other. The first connection electrode CNE1 may be disposed on the third insulating layer INS3, and may be connected to the drain "D" through a first contact hole CH1 defined by the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 defined by the fourth and fifth insulating layers INS4 and INS5.

A sixth insulating layer INS6 may be disposed on the second connection electrode CNE2. A layer from the buffer layer BFL to the sixth insulating layer INS6 may be defined as a circuit element layer DP-CL. The first insulating layer INS1 to the sixth insulating layer INS6 may be inorganic layers or organic layers.

The first electrode AE may be disposed on the sixth insulating layer INS6. The first electrode AE may be connected to the second connection electrode CNE2 through a third contact hole CH3 defined by (e.g., penetrating) the sixth insulating layer INS6. A pixel defining film PDL, in which an opening PX_OP for exposing a portion (e.g., a predetermined portion) of the first electrode AE is defined, may be disposed on the first electrode AE and the sixth insulating layer INS6.

The hole control layer HCL may be disposed on the first electrode AE and the pixel defining film PDL. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate light having any one of a red, green, and/or blue color.

The electron control layer ECL may be disposed on the light emitting layer EML and the hole control layer HCL. The electron control layer ECL may include an electron transport layer and an electron injection layer. The hole control layer HCL and the electron control layer ECL may be commonly arranged in the light emitting area LA and the non-light emitting area NLA.

The second electrode CE may be disposed on the electron control layer ECL. The second electrode CE may be commonly disposed in the pixels PX. A layer at (e.g., in or on) which the light emitting element OLED is disposed may be defined as a display element layer DP-OLED.

A thin film encapsulation layer TFE may be disposed on the second electrode CE to cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include inorganic insulating layers, and may protect the pixel PX from moisture/oxygen. The second encapsulation layer EN2 may include an organic insulating layer, and may protect the pixel PX from foreign substances, such as dust particles.

A first voltage may be applied to the first electrode AE through the transistor TR, and a second voltage having a level lower than that of the first voltage may be applied to the second electrode CE. Holes and electrons injected into the light emitting layer EML may be combined with (e.g., coupled to) each other to form excitons, and as the excitons transition to a ground state, the light emitting element OLED may emit light.

The input sensing unit ISP may be disposed on the thin film encapsulation layer TFE. The input sensing unit ISP may be directly manufactured on an upper surface of the thin film encapsulation layer TFE.

A base layer BSL may be disposed on the thin film encapsulation layer TFE. The base layer BSL may include an inorganic insulating layer. At least one inorganic insulating layer as the base layer BSL may be provided on the thin film encapsulation layer TFE.

The input sensing unit ISP may include a first conductive pattern CTL1, and a second conductive pattern CTL2 disposed on the first conductive pattern CTL1. The first conductive pattern CTL1 may be disposed on the base layer BSL. An insulating layer TINS may be disposed on the base layer BSL to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap with the non-light emitting area NLA. The first and second conductive patterns CTL1 and CTL2 may be arranged in the non-light emitting area NLA between the light emitting areas LA, and may have a mesh shape.

The first and second conductive patterns CTL1 and CTL2 may form sensors of the input sensing unit ISP. For example, the first and second conductive patterns CTL1 and CTL2 having a mesh shape may be spaced (e.g., separated) from each other in an area (e.g., a predetermined area) to form sensors. A portion of the second conductive pattern CTL2 may be connected to the first conductive pattern CTL1.

The reflection preventing layer RPL may be disposed on the second conductive pattern CTL2. The reflection preventing layer RPL may include a black matrix BM and a plurality of color filters CFT. The black matrix BM may overlap with the non-light emitting area NLA, and the color filters CFT may overlap with the light emitting areas LA.

The black matrix BM may be disposed on the insulating layer TINS to cover the second conductive pattern CTL2. An opening B_OP overlapping with the light emitting area LA and the opening PX_OP may be defined in the black matrix BM. The black matrix BM may absorb and block light. A width of the opening B_OP may be greater than a width of the opening PX_OP.

The color filters CFT may be arranged on the insulating layer TINS and the black matrix BM. The color filters CFT may be arranged in the openings B_OP, respectively. A planarization insulating layer PINS may be disposed on the color filters CFT. The planarization insulating layer PINS may provide a flat or substantially flat upper surface.

When external light moving toward the display panel DP is reflected by the display panel DP and provided back to a user, the user may visually recognize the external light like a mirror. To prevent or reduce such reflection, the reflection preventing layer RPL may include a plurality of color filters CFT that display the same colors as those of the pixels PX of the display panel DP. The color filters CFT may filter the external light into the same colors as those of the pixels PX. In this case, the external light may not be visually recognized by the user.

However, the present disclosure is not limited thereto, and the reflection preventing layer RPL may include a polarizing film to reduce a reflectance of an external light beam. The polarizing film may be separately manufactured and attached to the input sensing unit ISP by an adhesive layer. The polarizing film may include a phase retarder and/or a polarizer.

Figure 7:
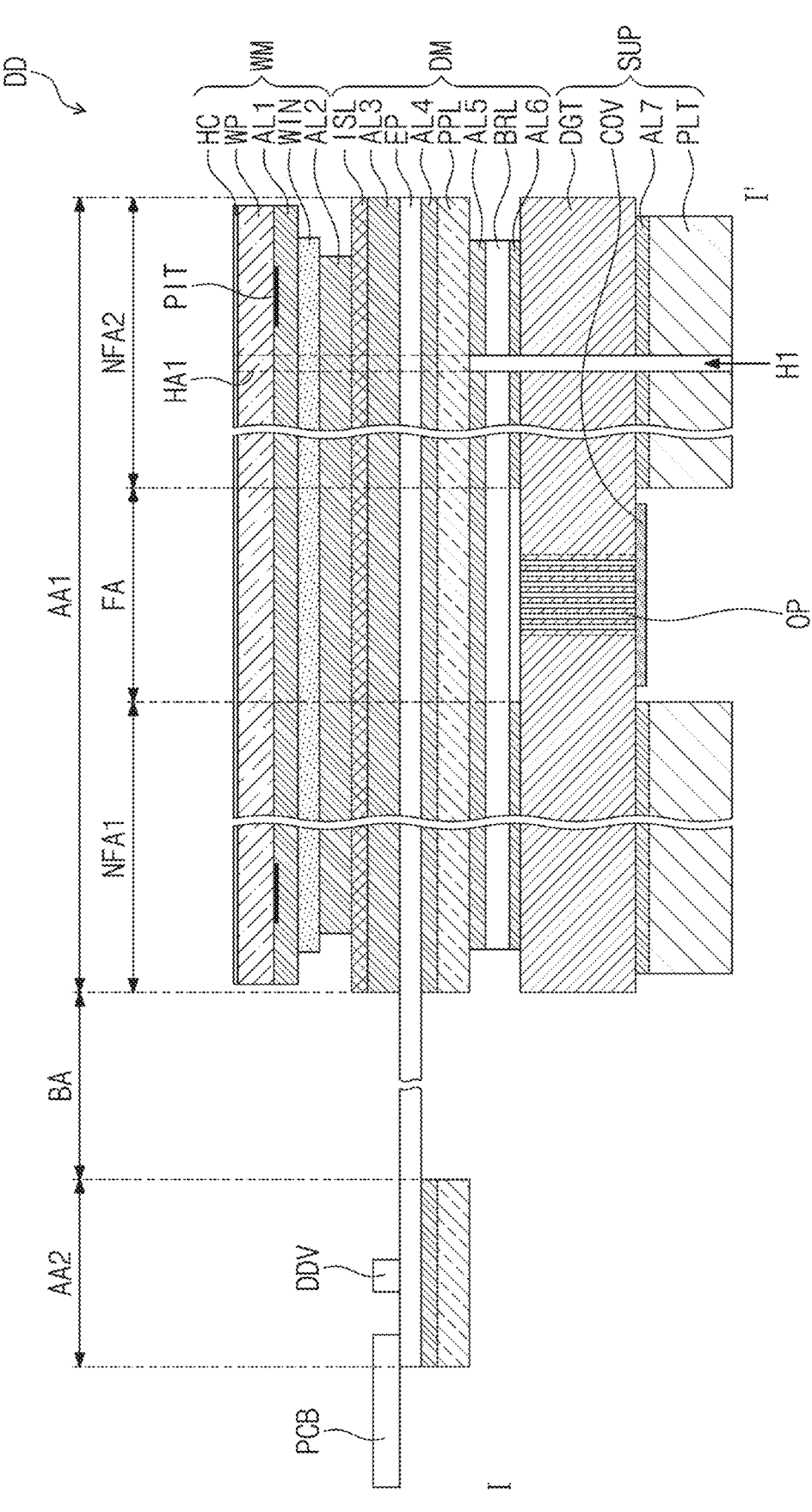
FIG. 7 is a cross-sectional view taken along the line I-I' illustrated in FIG. 5.
Figure 8:
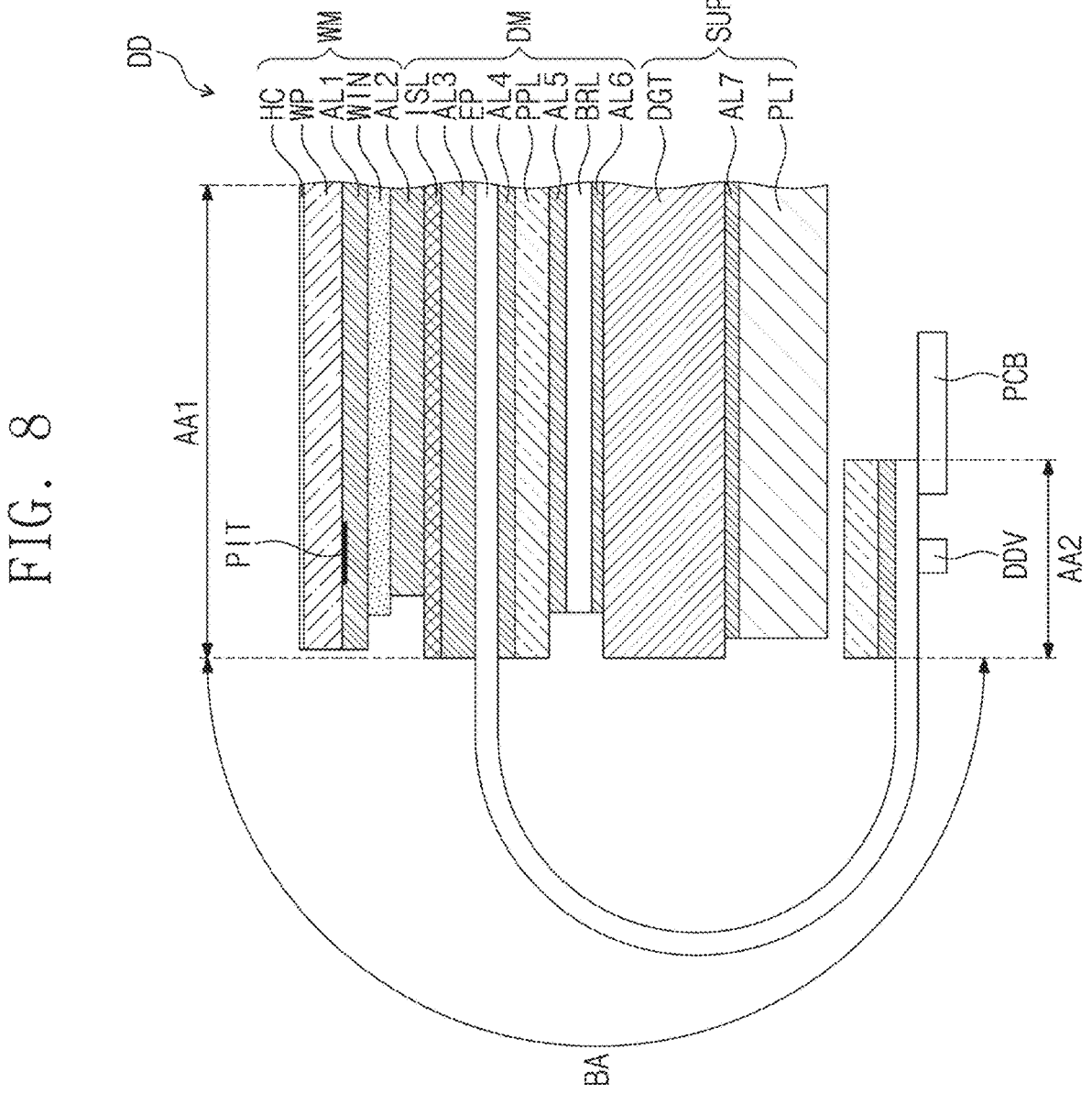
FIG. 8 is a view illustrating a bent state of a bending area illustrated in FIG. 7.

FIG. 7 is a cross-sectional view taken along the line I-I' illustrated in FIG. 5. FIG. 8 is a view illustrating a bent state of a bending area illustrated in FIG. 7.

In FIG. 7, a cross section of the display module DM and a cross section of the window module WM corresponding to line I-I' are illustrated together.

Referring to FIG. 7, the display device DD may include the display module DM, the window module WM disposed on the display module DM, and a support part SUP disposed under the display module DM. The display module DM may be a flexible display module. The display module DM may include the first non-folding area NFA1, the folding area FA, and the second non-folding area NFA2.

The window module WM may include a window WIN, a window protecting layer WP, a hard coating layer HC, and first and second adhesive layers AL1 and AL2. The display module DM may include the electronic panel EP, an impact absorbing layer ISL, the panel protecting layer PPL, a barrier layer BRL, and third to sixth adhesive layers AL3 to AL6. The support part SUP may include a digitizer DGT, a support plate PLT, a cover layer COV, and a seventh adhesive layer AL7.

The configurations of the electronic panel EP and the panel protecting layer PPL may be the same or substantially the same as those described above with reference to FIG. 4, and thus, redundant description thereof may not be repeated. The impact absorbing layer ISL may be disposed on the electronic panel EP. The impact absorbing layer ISL may protect the electronic panel EP by absorbing an external impact applied from an upper side of the display device DD toward the electronic panel EP. The impact absorbing layer ISL may be manufactured in the form of a stretched film.

The impact absorbing layer ISL may include a flexible plastic material. The flexible plastic material may be defined as a synthetic resin film. For example, the impact absorbing layer ISL may include a flexible plastic material, such as polyimide (PI) or polyethyleneterephthalate (PET).

The window WIN may be disposed on the impact absorbing layer ISL. The window WIN may protect the electronic panel EP from external scratches. The window WIN may have optically transparent properties. The window WIN may include glass. However, the present disclosure is not limited thereto, and the window WIN may include a synthetic resin film.

The window WIN may have a multi-layered structure or a single-layer structure. For example, the window WIN may include a plurality of synthetic resin films connected to (e.g., coupled to or attached to) each other with an adhesive, or may include a glass substrate and a synthetic resin film connected to (e.g., coupled to or attached to) each other with an adhesive.

The window protecting layer WP may be disposed on the window WIN. The window protecting layer WP may include a flexible plastic material, such as polyimide or polyethylene terephthalate. The hard coating layer HC may be disposed on an upper surface of the window protecting layer WP.

A printing layer PIT may be disposed on a lower surface of the window protecting layer WP. The printing layer PIT may have a black color, but the color of the printing layer PIT is not limited thereto. The printing layer PIT may be adjacent to an edge of the window protecting layer WP.

The barrier layer BRL may be disposed under the panel protecting layer PPL. The barrier layer BRL may increase a resistance against a compressive force caused by external pressure. Thus, the barrier layer BRL may serve to prevent or substantially prevent deformation of the electronic panel EP. The barrier layer BRL may include a flexible plastic material, such as polyimide or polyethylene terephthalate. The barrier layer BRL may have a color that absorbs light. For example, the barrier layer BRL may have a black color. In this case, when the display module DM is viewed from above, components arranged under the barrier layer BRL may not be visually recognized.

The first adhesive layer AL1 may be disposed between the window protecting layer WP and the window WIN. The window protecting layer WP and the window WIN may be bonded to each other by the first adhesive layer AL1. The first adhesive layer AL1 may cover the printing layer PIT.

The second adhesive layer AL2 may be disposed between the window WIN and the impact absorbing layer ISL. The window WIN and the impact absorbing layer ISL may be bonded to each other by the second adhesive layer AL2.

The third adhesive layer AL3 may be disposed between the impact absorbing layer ISL and the electronic panel EP. The impact absorbing layer ISL and the electronic panel EP may be bonded to each other by the third adhesive layer AL3.

The fourth adhesive layer AL4 may be disposed between the electronic panel EP and the panel protecting layer PPL. The electronic panel EP and the panel protecting layer PPL may be bonded to each other by the fourth adhesive layer AL4.

The fifth adhesive layer AL5 may be disposed between the panel protecting layer PPL and the barrier layer BRL. The panel protecting layer PPL and the barrier layer BRL may be bonded to each other by the fifth adhesive layer AL5.

The sixth adhesive layer AL6 may be disposed between the barrier layer BRL and the digitizer DGT. The barrier layer BRL and the digitizer DGT may be bonded to each other by the sixth adhesive layer AL6.

The sixth adhesive layer AL6 may overlap with the first and second non-folding areas NFA1 and NFA2, and may not overlap with the folding area FA. In other words, the sixth adhesive layer AL6 may not be disposed in the folding area FA.

The digitizer DGT may be disposed under the barrier layer BRL. As an example, a thickness of the digitizer DGT may be in a range of 37.5 μm to 400 μm. The digitizer DGT may include a plurality of layers, which will be described in more detail below.

The digitizer DGT may serve to support the display module DM from a lower side of the display module DM. For example, the digitizer DGT may include a non-metallic material, such as a reinforced fiber composite, to have a higher rigidity than that of the display module DM. The reinforced fiber composite may be carbon fiber reinforced plastic (CFRP) or glass fiber reinforced plastic (GFRP). Hereinafter, the digitizer DGT may be described in more detail as having a structure including GFRP as a representative example.

The digitizer DGT is a device that receives position information indicated by the user on a display screen. The digitizer DGT may be implemented in an electromagnetic method (e.g., an electromagnetic resonance method). For example, the digitizer DGT may include a digitizer sensor substrate including a plurality of coils. However, the present disclosure is not limited thereto, and the digitizer DGT may be implemented in an active electrostatic method.

When the user moves an electromagnetic pen on the display device DD, the electromagnetic pen may be driven by an alternating current (AC) signal to generate an oscillating magnetic field, and the oscillating magnetic field may induce a signal in the coil. A position of the electromagnetic pen may be detected through the signal induced in the coil. The digitizer DGT may determine the position of the electromagnetic pen by sensing electromagnetic changes that occur when the electromagnetic pen approaches.

A plurality of openings OP may be defined in a portion of the digitizer DGT, which overlaps with the folding area FA. The openings OP may be formed to pass through portions of the digitizer DGT in the third direction DR3. The openings OP may be formed in the digitizer DGT through a laser process or a micro-blast process.

As the openings OP are defined in a portion of the digitizer DGT, which overlaps with the folding area FA, flexibility of the portion of the digitizer DGT overlapping with the folding area FA may increase. As a result, the digitizer DGT may be easily folded about the folding area FA.

The cover layer COV may be disposed under the digitizer DGT. The cover layer COV may cover the openings OP defined in the digitizer DGT under the digitizer DGT. The cover layer COV may overlap with the folding area FA, and may not overlap with the first and second non-folding areas NFA1 and NFA2. In other words, the cover layer COV may not be disposed in the first and second non-folding areas NFA1 and NFA2. The cover layer COV may be in contact with a lower surface of a portion of the digitizer DGT in which the openings OP are formed.

The cover layer COV may have a lower elastic modulus than that of the digitizer DGT. For example, the cover layer COV may include thermoplastic polyurethane or rubber, but the material of the cover layer COV is not limited thereto.

The cover layer COV may be manufactured in the form of a sheet, and attached to the digitizer DGT.

The support plate PLT may be disposed under the digitizer DGT. The support plate PLT may overlap with the first and second non-folding areas NFA1 and NFA2, and may not overlap with the folding area FA. The support plate PLT may be divided into two parts, which may be arranged under the first and second non-folding areas NFA1 and NFA2, respectively.

The support plate PLT may have a higher rigidity than that of the display module DM. The support plate PLT may include a metal material, such as stainless steel (e.g., SUS 316), but the metal material of the support plate PLT is not limited thereto. Further, the present disclosure is not limited thereto, and the support plate PLT may include a non-metallic material, such as plastic.

The seventh adhesive layer AL7 may be disposed between the digitizer DGT and the support plate PLT. The digitizer DGT and the support plate PLT may be bonded to each other by the seventh adhesive layer AL7. The seventh adhesive layer AL7 may not be disposed in the folding area FA.

The first to seventh adhesive layers AL1 to AL7 may include a transparent adhesive, such as a pressure sensitive adhesive (PSA) or an optically clear adhesive (OCA), but the type of adhesive is limited thereto.

A first hole H1 may be defined in a portion of the display module DM, which overlaps with the first hole area HA1. The first hole H1 may be defined from the support plate PLT to the panel protecting layer PPL. For example, the first hole H1 may be integrally defined in (e.g., may integrally penetrate) the barrier layer BRL, the digitizer DGT, the support plate PLT, and the fifth to seventh adhesive layers AL5 to AL7.

A second hole may be formed in the second hole area HA2 (e.g., see FIG. 5), and the second hole may be defined from the support plate PLT before the panel protecting layer PPL, which is like the first hole H1. The camera CA may be disposed in the first hole H1, and the sensor SN may be disposed in the second hole.

Referring to FIGS. 7 and 8, the panel protecting layer PPL and the fourth adhesive layer AL4 may not be arranged under the bending area BA. The panel protecting layer PPL and the fourth adhesive layer AL4 may be arranged under the second area AA2 of the electronic panel EP. The data driver DDV may be disposed on the second area AA2 of the electronic panel EP.

A printed circuit board PCB may be connected to the second area AA2 of the electronic panel EP. The printed circuit board PCB may be connected to one side of the second area AA2. The bending area BA may be bent, and thus, the second area AA2 may be disposed under the first area AA1. Thus, the data driver DDV and the printed circuit board PCB may be arranged under the first area AA1.

Figure 9:
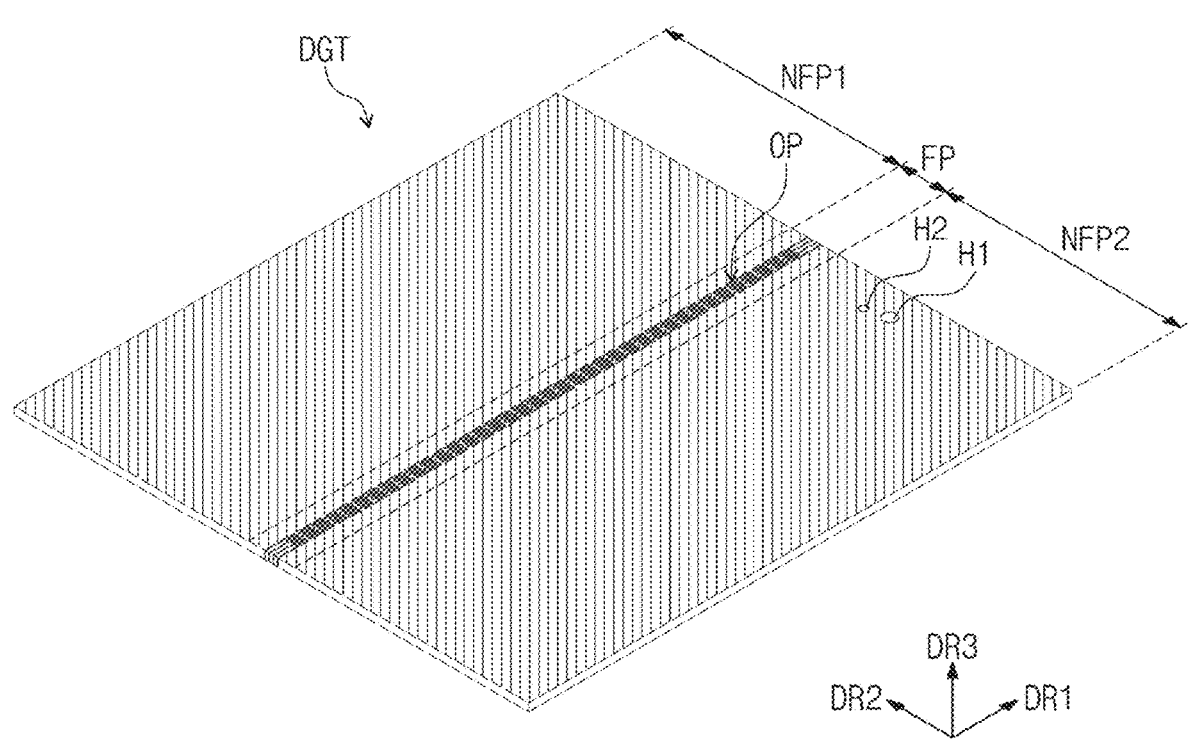
FIG. 9 is a perspective view of a digitizer illustrated in FIG. 7.

FIG. 9 is a perspective view of a digitizer illustrated in FIG. 7.

Referring to FIGS. 7 and 9, the digitizer DGT may include a first non-folding part NFP1, a folding part FP, and a second non-folding part NFP2 that are arranged along the second direction DR2. The first non-folding part NFP1, the folding part FP, and the second non-folding part NFP2 may overlap with the first non-folding area NFA1, the folding area FA, and the second non-folding area NFA2, respectively.

A grid pattern may be defined in the folding part FP. For example, the plurality of openings OP may be defined in the folding part FP. The openings OP may be arranged in a desired rule (e.g., a predetermined rule). The openings OP may be arranged in a grid shape to form a grid pattern of the folding part FP. An area, in which the openings OP are formed with respect to the second direction DR2, may be smaller than a width of the folding part FP.

As the openings OP are defined in the folding part FP, an area of the folding part FP may be reduced, and thus, the rigidity of the folding part FP may be lowered. Thus, when the openings OP are defined in the folding part FP, the flexibility of the folding part FP may be increased as compared to a case in which the openings OP are not defined in the folding part FP. As a result, the folding part FP may be folded more easily.

The first hole H1 and a second hole H2 may be defined in the second non-folding part NFP2. The first hole H1 and the second hole H2 may be adjacent to an edge of the second non-folding part NFP2.

The digitizer DGT may include a plurality of layers. The layers of the digitizer DGT will be described in more detail below with reference to FIGS. 10A to 13.

Figure 10A:
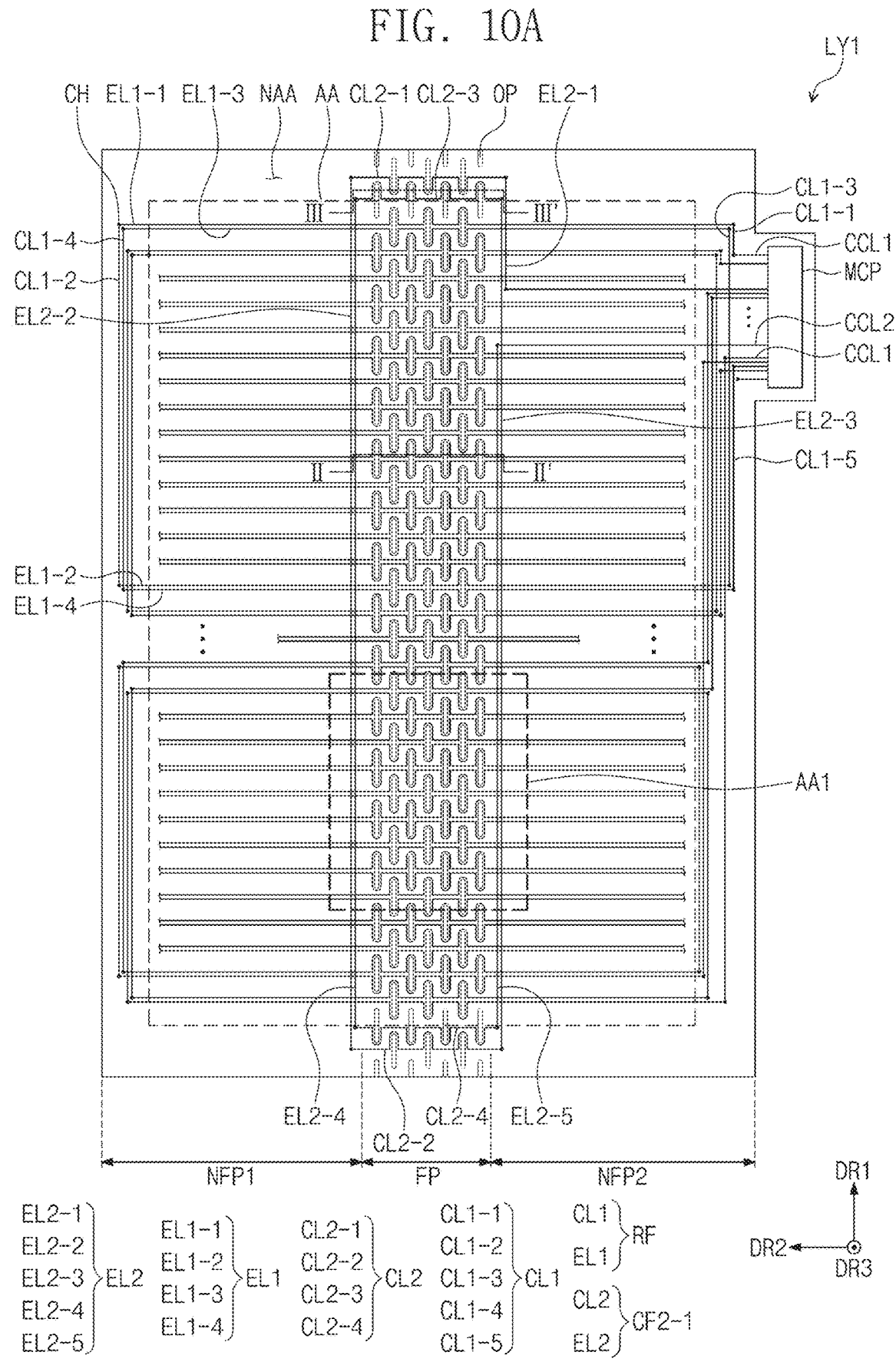
FIGS. 10A-10C are views illustrating a first layer of the digitizer.
Figure 10B:
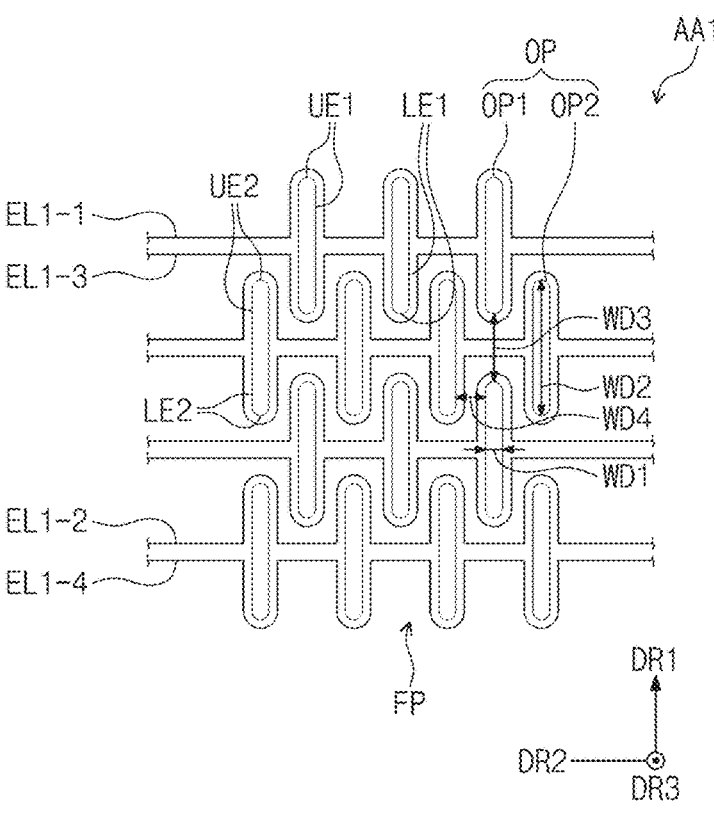
Figure 10C:
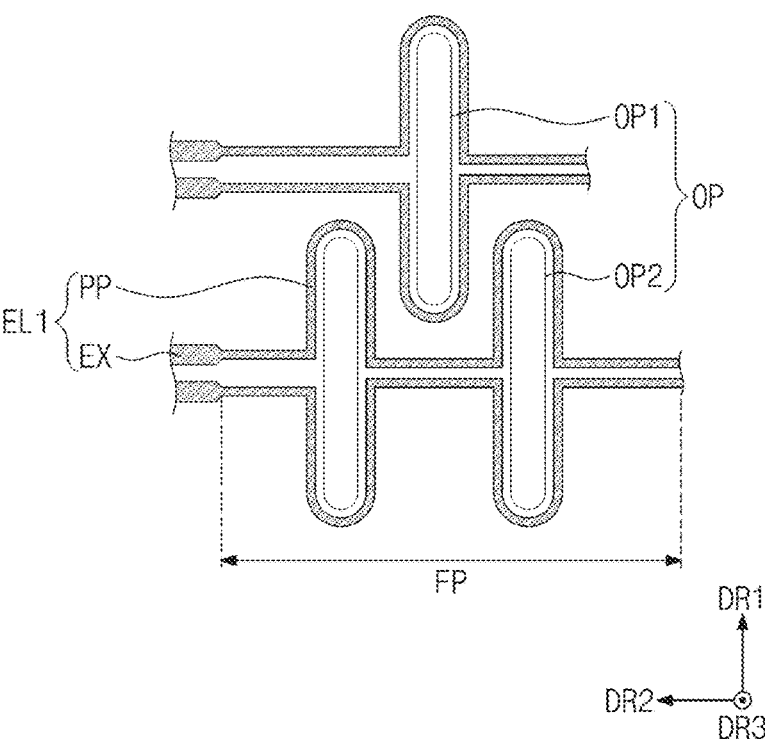
Figure 11A:
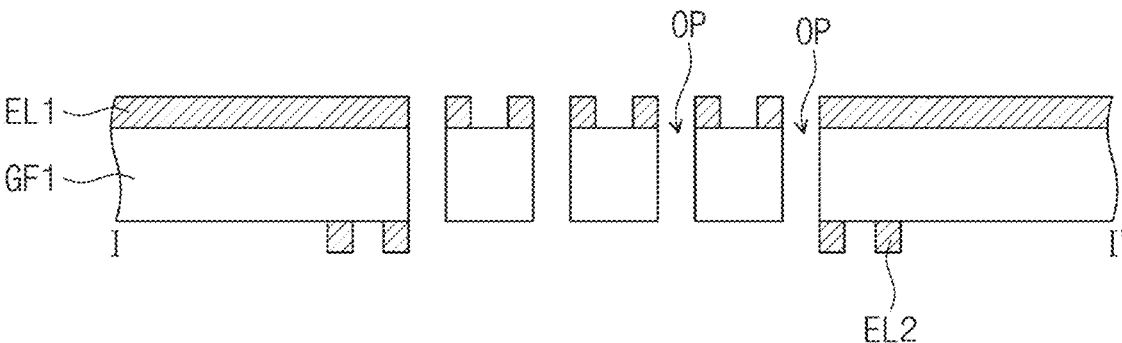
FIG. 11A is a cross-sectional view taken along the line II-II' illustrated in FIG. 10A.
Figure 11B:
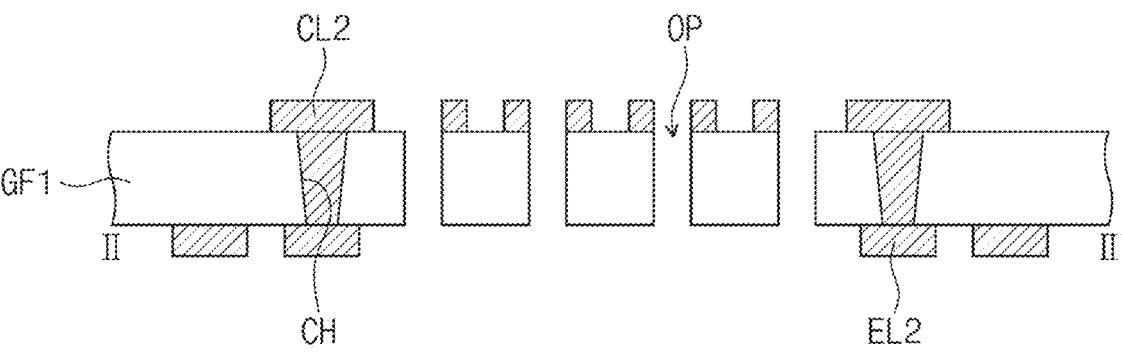
FIG. 11B is a cross-sectional view taken along the line III-III' illustrated in FIG. 10A.
Figure 12:
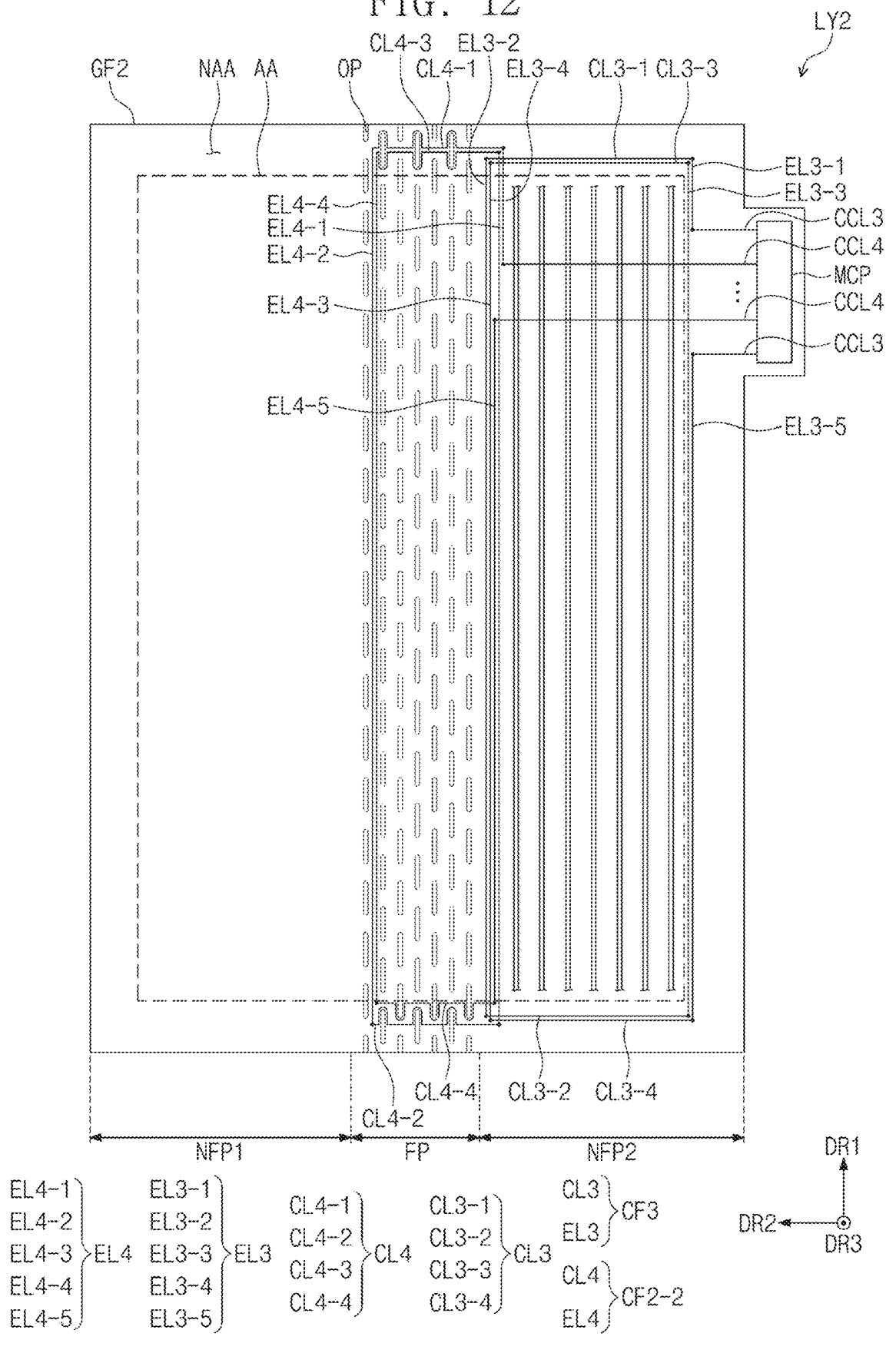
FIG. 12 is a view illustrating a second layer of the digitizer.
Figure 13:
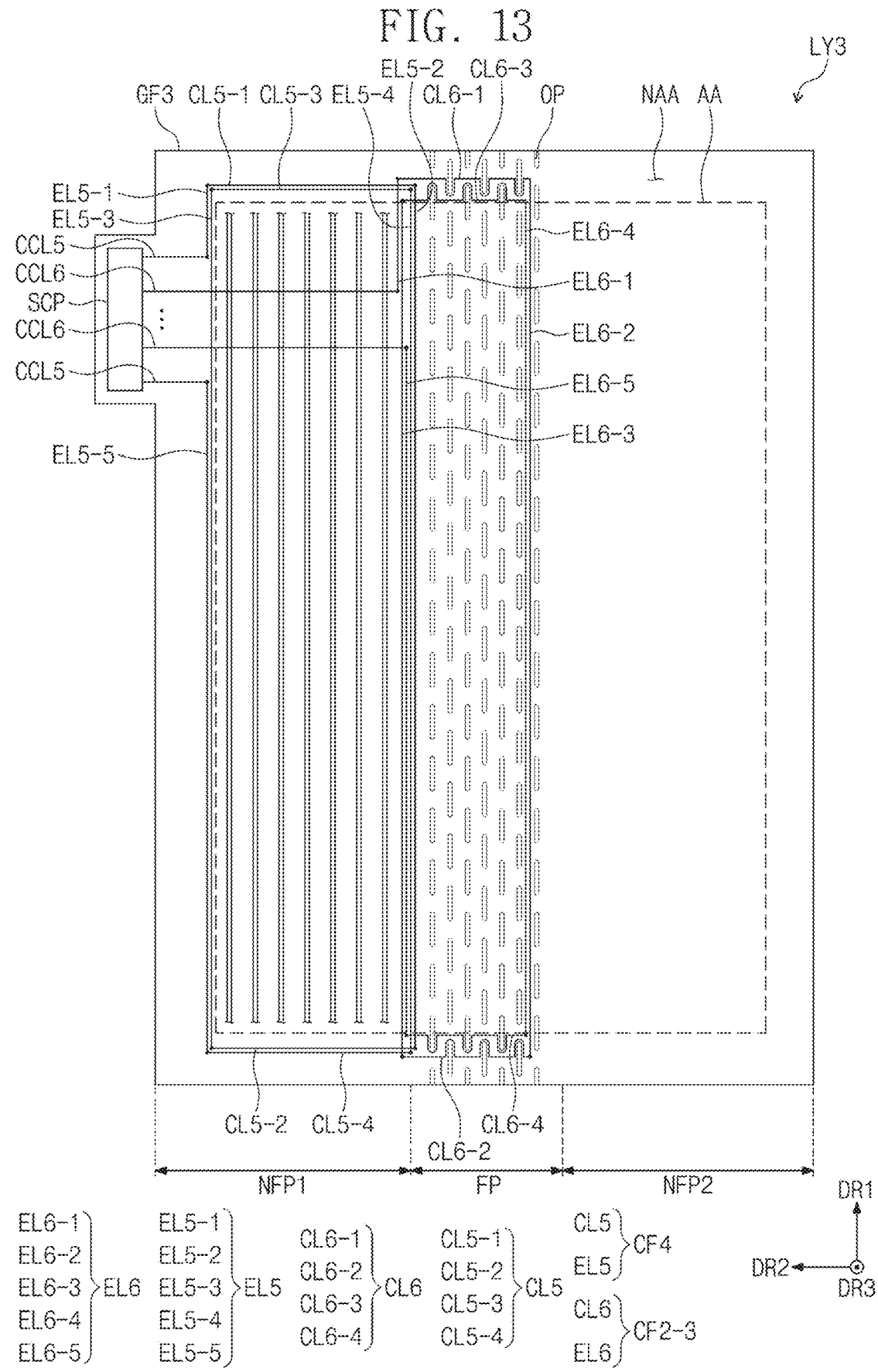
FIG. 13 is a view illustrating a third layer of the digitizer.

FIGS. 10A through 10C are views illustrating a first layer of the digitizer. FIG. 11A is a cross-sectional view taken along the line II-II' illustrated in FIG. 10A. FIG. 11B is a cross-sectional view taken along the line III-III' illustrated in FIG. 10A. FIG. 12 is a view illustrating a second layer of the digitizer. FIG. 13 is a view illustrating a third layer of the digitizer.

FIGS. 10A to 13 are plan views.

FIG. 10B is an enlarged plan view of the first area AA1 illustrated in FIG. 10A. FIG. 10C is an enlarged plan view of a portion of FIG. 10B.

A second sensing coil may include a $(2\text{-}1)^{th}$ sensing coil CF2-1, a $(2\text{-}2)^{th}$ sensing coil CF2-2, and a $(2\text{-}3)^{th}$ sensing coil CF2-3.

The first non-folding part NFP1, the folding part FP, and the second non-folding part NFP2 of FIGS. 10A, 12, and 13 may be the same or substantially the same as the first non-folding part NFP1, the folding part FP, and the second non-folding part NFP2 described above with reference to FIG. 9, and thus, redundant description thereof may not be repeated or may be simplified.

Referring to FIGS. 10A, 12, and 13, an area of the digitizer DGT on a plane (e.g., in a plan view) may include an active area AA, and a non-active area NAA around (e.g., adjacent to) the active area AA. The non-active area NAA may surround (e.g., around a periphery of) the active area AA. The active area AA may overlap with the display area DA (e.g., see FIG. 1), and the non-active area NAA may overlap with the non-display area NDA.

The digitizer DGT (e.g., see FIG. 9) may include first to third layers LY1, LY2, and LY3. The first to third layers LY1, LY2, and LY3 may be sequentially laminated from top to bottom. In other words, the first layer LY1 may be disposed on an uppermost side, the second layer LY2 may be disposed under the first layer LY1, and the third layer LY3 may be disposed under the second layer LY2.

Referring to FIG. 10A, the first layer LY1 of the digitizer DGT may include a main connector MCP, a plurality of first connector connection wiring lines CCL1, a plurality of second connector connection wiring lines CCL2, a plurality of first sensing coils RF, and the $(2\text{-}1)^{th}$ sensing coil CF2-1. The main connector MCP may be disposed on one side of the digitizer DGT. As an example, the main connector MCP may be disposed in the non-active area NAA on the right side. The main connector MCP may be disposed in the second non-folding part NFP2.

The first connector connection wiring lines CCL1 may be arranged in the non-active area NAA on the right side. The first connector connection wiring lines CCL1 may extend in the second direction DR2, may be arranged along the first direction DR1, and may be connected to the main connector MCP. The first sensing coils RF may be connected to the main connector MCP through the first connector connection wiring lines CCL1.

The first sensing coils RF may extend from the main connector MCP to form a loop shape together with the first connector connection wiring lines CCL1. For example, the first sensing coils RF extending from the main connector MCP may extend to the non-active area NAA on the right side, the active area AA, and the non-active area NAA on the left side, and then may extend to the active area AA and the non-active area NAA on the right side, and may be connected to the first connector connection wiring lines CCL1.

One first sensing coil RF connected to the two first connector connection wiring lines CCL1 may form a plurality of loop shapes. The first sensing coils RF connected to one first connector connection wiring line CCL1 from among the first connector connection wiring lines CCL1 extending from the main connector MCP may extend to the non-active area NAA on the right side, the active area AA, and the non-active area NAA on the left side a plurality of times. The first sensing coils RF may extend to the non-active area NAA on the left side a plurality of times, and may then extend to the active area AA and the non-active area NAA on the right side again.

As illustrated in FIG. 10A, the first sensing coil RF connected to the one first connector connection wiring line CCL1 may form two loops. The first sensing coil RF may form two loops, may then be connected to the first connector connection wiring line CCL1 again, and may be connected to the main connector MCP. However, the present disclosure is not limited thereto, and one first sensing coil RF may form one loop.

Some of the first sensing coils RF are illustrated as the loop shapes, the loop shapes of the other first sensing coils RF are omitted, and the other first sensing coils RF extend in the second direction DR2 inside the active area AA. However, the present disclosure is not limited thereto, and the other first sensing coils RF may also extend in the loop shapes.

Each of the first sensing coils RF may include first extension wiring lines EL1 and a plurality of first connection wiring lines CL1. The first extension wiring lines EL1 may be arranged in the active area AA, may extend in the second direction DR2, and may be arranged along the first direction DR1. For example, each of the first sensing coils RF includes two pairs of first extension wiring lines EL1, and the two pairs of first extension wiring lines EL1 extend parallel to or substantially parallel to each other in the second direction DR2. Among the two pairs of first extension wiring lines EL1, one pair of first extension wiring lines EL1 may be closer to the non-active area NAA on the upper side than the other pair of first extension wiring lines EL1. Hereinafter, for convenience, one of the first sensing coils RF will be described in more detail.

The two pairs of first extension wiring lines EL1 may extend through the openings OP. The first extension wiring lines EL1 may extend from the folding part FP to be curved along edges of the openings OP. The pair of first extension wiring lines EL1 may be arranged adjacent to each other in the active area AA, and may extend parallel to or substantially parallel to each other in the second direction DR2.

The two pairs of first extension wiring lines EL1 may include a $(1\text{-}1)^{th}$ extension wiring line EL1-1, a $(1\text{-}2)^{th}$ extension wiring line EL1-2, a $(1\text{-}3)^{th}$ extension wiring line EL1-3, and a $(1\text{-}4)^{th}$ extension wiring line EL1-4. The $(1\text{-}1)^{th}$ extension wiring line EL1-1 may extend in the second direction DR2. The (1-1)$^{th}$ extension wiring line EL1-1 may extend in the second direction DR2, and pass through the first non-folding part NFP1, the folding part FP, and the second non-folding part NFP2.

The (1-2)$^{th}$ extension wiring line EL1-2 may extend in the second direction DR2, and may be parallel to or substantially parallel to the (1-1)$^{th}$ extension wiring line EL1-1 in the first direction DR1. The (1-2)$^{th}$ extension wiring line EL1-2 may extend in the second direction DR2, and pass through the first non-folding part NFP1, the folding part FP, and the second non-folding part NFP2.

The (1-3)$^{th}$ extension wiring line EL1-3 may be disposed adjacent to the (1-1)$^{th}$ extension wiring line EL1-1. The (1-3)$^{th}$ extension wiring line EL1-3 may extend in the second direction DR2, and may be parallel to or substantially parallel to the (1-1)$^{th}$ extension wiring line EL1-1. The (1-3)$^{th}$ extension wiring line EL1-3 may be spaced further apart from the non-active area NAA on the upper side than the (1-1)$^{th}$ extension wiring line EL1-1.

The (1-4)$^{th}$ extension wiring line EL1-4 may be disposed adjacent to the (1-2)$^{th}$ extension wiring line EL1-2. The (1-4)$^{th}$ extension wiring line EL1-4 may extend in the second direction DR2, and may be parallel to or substantially parallel to the (1-2)$^{th}$ extension wiring line EL1-2. The (1-4)$^{th}$ extension wiring line EL1-4 may be spaced further apart from the non-active area NAA on the upper side than the (1-2)$^{th}$ extension wiring line EL1-2.

A length of the first extension wiring lines EL1 may be different from a length of the first connection wiring lines CL1. For example, the first extension wiring lines EL1 may be longer than the first connection wiring lines CL1, but the present disclosure is not limited thereto.

The first connection wiring lines CL1 may be arranged in the non-active area NAA, and may extend in the first direction DR1. As an example, the first connection wiring lines CL1 may be arranged in the non-active area NAA on the left and right sides. The first connection wiring lines CL1 may be connected to the first extension wiring lines EL1. For example, the first connection wiring lines CL1 of each of the first sensing coils RF may be connected to both ends (e.g., opposite ends) of the first extension wiring lines EL1 of each of the first sensing coils RF.

The first extension wiring lines EL1 may be arranged at (e.g., in or on) a different layer from that of the first connection wiring lines CL1. For example, the first connection wiring lines CL1 may be disposed under the first extension wiring lines EL1. The first connection wiring lines CL1 may be connected to the first extension wiring lines EL1 through a contact hole CH.

The first connection wiring lines CL1 may include a (1-1)$^{th}$ connection wiring line CL1-1, a (1-2)$^{th}$ connection wiring line CL1-2, a (1-3)$^{th}$ connection wiring line CL1-3, a (1-4)$^{th}$ connection wiring line CL1-4, and a (1-5)$^{th}$ connection wiring line CL1-5. The (1-1)$^{th}$ connection wiring line CL1-1 may be disposed in the non-active area NAA on the right side.

One side of both sides (e.g., one of opposite sides) of the (1-1)$^{th}$ connection wiring line CL1-1, which are opposite to each other in the first direction DR1, may be connected to the first connector connection wiring line CCL1. The (1-1)$^{th}$ connection wiring line CL1-1 may extend in the first direction DR1. The (1-1)$^{th}$ connection wiring line CL1-1 may extend from the first connector connection wiring line CCL1 in the first direction DR1, and the other side of the (1-1)$^{th}$ connection wiring line CL1-1 may be connected to the (1-1)$^{th}$ extension wiring line EL1-1. The (1-1)$^{th}$ extension wiring line EL1-1 and the first connector connection wiring line CCL1 may be connected to each other by the (1-1)$^{th}$ connection wiring line CL1-1. The (1-1)$^{th}$ connection wiring line CL1-1 may be disposed under the first connector connection wiring line CCL1 and the (1-1)$^{th}$ extension wiring line EL1-1.

The (1-2)$^{th}$ connection wiring line CL1-2 may be disposed in the non-active area NAA on the left side. The (1-2)$^{th}$ connection wiring line CL1-2 may extend in the first direction DR1. The (1-2)$^{th}$ connection wiring line CL1-2 may be parallel to or substantially parallel to the (1-1)$^{th}$ connection wiring line CL1-1. A length of the (1-2)$^{th}$ connection wiring line CL1-2 in the first direction DR1 may be greater than a length of the (1-1)$^{th}$ connection wiring line CL1-1 in the first direction DR1.

One side of both sides (e.g., one of opposite sides) of the (1-2)$^{th}$ connection wiring line CL1-2, which are opposite to each other in the first direction DR1, may be connected to the (1-1)$^{th}$ extension wiring line EL1-1. The other side of the (1-2)$^{th}$ connection wiring line CL1-2 may be connected to the (1-2)$^{th}$ extension wiring line EL1-2. The (1-1)$^{th}$ extension wiring line EL1-1 and the (1-2)$^{th}$ extension wiring line EL1-2 may be connected to each other by the (1-2)$^{th}$ connection wiring line CL1-2. The (1-2)$^{th}$ connection wiring line CL1-2 may be disposed under the (1-1)$^{th}$ extension wiring line EL1-1 and the (1-2)$^{th}$ extension wiring line EL1-2.

The (1-3)$^{th}$ connection wiring line CL1-3 may be disposed in the non-active area NAA on the right side. The (1-3)$^{th}$ connection wiring line CL1-3 may be disposed adjacent to the (1-1)$^{th}$ connection wiring line CL1-1. The (1-3)$^{th}$ connection wiring line CL1-3 may extend in the first direction DR1, and may be parallel to or substantially parallel to the (1-1)$^{th}$ connection wiring line CL1-1. The (1-3)$^{th}$ connection wiring line CL1-3 may be closer to the active area AA than the (1-1)$^{th}$ connection wiring line CL1-1.

One side of both sides (e.g., one of opposite sides) of the (1-3)$^{th}$ connection wiring line CL1-3, which are opposite to each other in the first direction DR1, may be connected to the (1-2)$^{th}$ extension wiring line EL1-2. The other side of the (1-3)$^{th}$ connection wiring line CL1-3 may be connected to the (1-3)$^{th}$ extension wiring line EL1-3. The (1-2)$^{th}$ extension wiring line EL1-2 and the (1-3)$^{th}$ extension wiring line EL1-3 may be connected to each other by the (1-3)$^{th}$ connection wiring line CL1-3. The (1-3)$^{th}$ connection wiring line CL1-3 may be disposed under the (1-2)$^{th}$ extension wiring line EL1-2 and the (1-3)$^{th}$ extension wiring line EL1-3.

The (1-4)$^{th}$ connection wiring line CL1-4 may be disposed on the non-active area NAA on the left side. The (1-4)$^{th}$ connection wiring line CL1-4 may extend in the first direction DR1. The (1-4)$^{th}$ connection wiring line CL1-4 may be disposed adjacent to the (1-2)$^{th}$ connection wiring line CL1-2. The (1-4)$^{th}$ connection wiring line CL1-4 may extend in the first direction DR1, and may be parallel to or substantially parallel to the (1-2)$^{th}$ connection wiring line CL1-2. The (1-4)$^{th}$ connection wiring line CL1-4 may be closer to the active area AA than the (1-2)$^{th}$ connection wiring line CL1-2.

One side of both sides (e.g., one of opposite sides) of the (1-4)$^{th}$ connection wiring line CL1-4, which are opposite to each other in the first direction DR1, may be connected to the (1-3)$^{th}$ extension wiring line EL1-3. The other side of the (1-4)$^{th}$ connection wiring line CL1-4 may be connected to the (1-4)$^{th}$ extension wiring line EL1-4. The (1-3)$^{th}$ extension wiring line EL1-3 and the (1-4)$^{th}$ extension wiring line EL1-4 may be connected to each other by the (1-4)$^{th}$ connection wiring line CL1-4. The $(1-4)^{th}$ connection wiring line CL1-4 may be disposed under the $(1-3)^{th}$ extension wiring line EL1-3 and the $(1-4)^{th}$ extension wiring line EL1-4.

The $(1-5)^{th}$ connection wiring line CL1-5 may be disposed in the non-active area NAA on the right side. The $(1-5)^{th}$ connection wiring line CL1-5 may extend in the first direction DR1. The $(1-5)^{th}$ connection wiring line CL1-5 may be disposed adjacent to the $(1-3)^{th}$ connection wiring line CL1-3. The $(1-5)^{th}$ connection wiring line CL1-5 may extend in the first direction DR1, and may be parallel to or substantially parallel to the $(1-3)^{th}$ connection wiring line CL1-3. The $(1-3)^{th}$ connection wiring line CL1-3 may be closer to the active area AA than the $(1-5)^{th}$ connection wiring line CL1-5. A length of the $(1-5)^{th}$ connection wiring line CL1-5 in the first direction DR1 may be smaller than a length of the $(1-3)^{th}$ connection wiring line CL1-3 in the first direction DR1.

One side of both sides (e.g., one of opposite sides) of the $(1-5)^{th}$ connection wiring line CL1-5, which are opposite to each other in the first direction DR1, may be connected to the $(1-4)^{th}$ extension wiring line EL1-4. The other side of the $(1-5)^{th}$ connection wiring line CL1-5 may be connected to the first connector connection wiring line CCL1. The $(1-4)^{th}$ extension wiring line EL1-4 and the first connector connection wiring line CCL1 may be connected to each other by the $(1-5)^{th}$ connection wiring line CL1-5. The $(1-5)^{th}$ connection wiring line CL1-5 may be disposed under the $(1-4)^{th}$ extension wiring line EL1-4 and the first connector connection wiring line CCL1.

Because the first extension wiring lines EL1, the first connector connection wiring lines CCL1, and the first connection wiring lines CL1 are connected to each other, the first sensing coils RF may form a plurality of loops. For convenience, one first sensing coil RF has been described in more detail, and the other first sensing coils RF may also form loops in the same or substantially the same manner.

Referring to FIGS. 10A to 10C, the openings OP may include first openings OP1 arranged in a $k^{th}$ row, and second openings OP2 arranged in a $(k+1)^{th}$ row, where k is a natural number. The first openings OP1 and the second openings OP2 may be arranged alternately with each other. A row may correspond to the second direction DR2.

As an example, the number of first openings OP1 may be smaller than the number of second openings OP2 in the second direction DR2, but the present disclosure is not limited thereto.

Each of the openings OP defined in the folding part FP may have a first width WD1 in the second direction DR2. The first width WD1 may be in a range of 0.1 mm to 0.3 mm. Each of the openings OP may have a second width WD2 in the first direction DR1. The second width WD2 may be in a range of 5.5 mm to 6 mm. A distance between the openings OP1 that are adjacent to each other in the first direction DR1 may be defined as a third width WD3. The third width WD3 may be in a range of 0.43 mm to 0.66 mm. A distance between one of the first openings OP1 and one of the second openings OP2 adjacent thereto in the second direction DR2 may be defined as a fourth width WD4. The fourth width WD4 may be in a range of 0.2 mm to 0.34 mm.

The first extension wiring lines EL1 may extend through a gap between the first openings OP1 and the second openings OP2. The first extension wiring lines EL1 may extend along edges of the first openings OP1 and edges of the second openings OP2.

The first extension wiring lines EL1 may be curved, and may extend to have a shape corresponding to the edges of the first openings OP1 and the edges of the second openings OP2. For example, the $(1-1)^{th}$ extension wiring lines EL1-1 and the $(1-3)^{th}$ extension wiring lines EL1-3 may be curved, and may extend between the first openings OP1 and the second openings OP2 to have the shape corresponding to the edges of the first openings OP1 and the edges of the second openings OP2.

In an embodiment of the present disclosure, when viewed on a plane (e.g., in a plan view), each of upper edges UE1 and UE2 may be defined as an edge of the corresponding opening OP formed above a center of the corresponding opening OP in the first direction DR1. Further, when viewed on a plane (e.g., in a plan view), each of lower edges LE1 and LE2 may be defined as an edge of the corresponding opening OP formed below the center of the corresponding opening OP in the first direction DR1.

Among the first extension wiring lines EL1, the $(1-1)^{th}$ extension wiring lines EL1-1 may extend along the upper edge UE1 of each of the first openings OP1 and the upper edge UE2 of each of the second openings OP2 in the folding part FP. The $(1-2)^{th}$ extension wiring lines EL1-2 may extend along the upper edge UE1 of each of the first openings OP1 and the upper edge UE2 of each of the second openings OP2 in the folding part FP.

Among the first extension wiring lines EL1, the $(1-3)^{th}$ extension wiring lines EL1-3 may extend along the lower edge LE1 of each of the first openings OP1 and the lower edge LE2 of each of the second openings OP2 in the folding part FP. The $(1-4)^{th}$ extension wiring lines EL1-4 may extend along the lower edge LE1 of each of the first openings OP1 and the lower edge LE2 of each of the second openings OP2 in the folding part FP.

Referring to FIGS. 10A and 10C, each of the $(1-1)^{th}$ to $(1-4)^{th}$ extension wiring lines EL1-1, EL1-2, EL1-3, and EL1-4 may include extension lines EX and pattern portions PP. The pattern portions PP may be defined as portions of the first extension wiring lines EL1 extending along the edges of the openings OP. The extension lines EX may be defined as portions of the first extension wiring lines EL1 that are not arranged in the pattern portion PP. The pattern portions PP may extend from the extension lines EX. In other words, in an embodiment of the present disclosure, the pattern portions PP may be formed integrally with the extension lines EX.

The extension lines EX may have a width that is greater than a width of each of the pattern portions PP. Because an area between the openings OP is limited, in order for the first extension wiring lines EL1 to pass between the openings OP, a width of the first extension wiring lines EL1 may be smaller between the openings OP.

Referring to FIG. 10A, the second connector connection wiring lines CCL2 may be arranged in the non-active area NAA on the right side. The second connector connection wiring lines CCL2 may extend in the second direction DR2, may be arranged along the first direction DR1, and may be connected to the main connector MCP. The $(2-1)^{th}$ sensing coils CF2-1 may be connected to the main connector MCP through the second connector connection wiring lines CCL2.

The $(2-1)^{th}$ sensing coil CF2-1 may form a loop shape. The $(2-1)^{th}$ sensing coil CF2-1 connected to the second connector connection wiring lines CCL2 may form a loop shape within the active area AA. When viewed on a plane (e.g., in a plan view), the $(2-1)^{th}$ sensing coil CF2-1 may surround (e.g., around a periphery of) the folding part FP.

When viewed on a plane (e.g., in a plan view), the $(2-1)^{th}$ sensing coil CF2-1 may surround (e.g., around a periphery of) the openings OP.

The $(2-1)^{th}$ sensing coil CF2-1 may form a plurality of loop shapes. As an example, referring to FIG. 10A, the $(2-1)^{th}$ sensing coil CF2-1 may form two loop shapes. The $(2-1)^{th}$ sensing coil CF2-1 may form two loops, may then be connected to the second connector connection wiring line CCL2 again, and may be connected to the main connector MCP. However, the present disclosure is not limited thereto, and the $(2-1)^{th}$ sensing coil CF2-1 may form one loop shape or more than two loop shapes.

When viewed on a plane (e.g., in a plan view), the two loops may have different sizes from each other. Hereinafter, from among the two loops, the loop having a larger size may be defined as a first loop, and the loop having a smaller size may be defined as a second loop.

The $(2-1)^{th}$ sensing coil CF2-1 may include a plurality of second extension wiring lines EL2 and a plurality of second connection wiring lines CL2. The second extension wiring lines EL2 may be arranged in the active area AA, may extend in the first direction DR1, and may be arranged along the second direction DR2. As an example, each of the $(2-1)^{th}$ sensing coils CF2-1 may include two pairs of second extension wiring lines EL2, and the two pairs of second extension wiring lines EL2 may extend in parallel to or substantially parallel to each other in the first direction DR1. The second connection wiring lines CL2 may extend along the edges of the openings OP.

The second extension wiring lines EL2 may include a $(2-1)^{th}$ extension wiring line EL2-1, a $(2-2)^{th}$ extension wiring line EL2-2, a $(2-3)^{th}$ extension wiring line EL2-3, a $(2-4)^{th}$ extension wiring line EL2-4, and a $(2-5)^{th}$ extension wiring line EL2-5. The $(2-1)^{th}$ extension wiring line EL2-1 may be disposed on the second non-folding part NFP2 adjacent to the folding part FP. The $(2-1)^{th}$ extension wiring line EL2-1 may extend in the first direction DR1. One side of both sides (e.g., one of opposite sides) of the $(2-1)^{th}$ extension wiring lines EL2-1, which are opposite to each other in the first direction DR1, may be connected to the second connector connection wiring line CCL2.

The $(2-2)^{th}$ extension wiring line EL2-2 may be disposed on the first non-folding part NFP1 adjacent to the folding part FP. The $(2-2)^{th}$ extension wiring line EL2-2 may extend in the first direction DR1. The $(2-2)^{th}$ extension wiring line EL2-2 may be parallel to or substantially parallel to the $(2-1)^{th}$ extension wiring line EL2-1.

The $(2-3)^{th}$ extension wiring line EL2-3 may be disposed on the second non-folding part NFP2 adjacent to the folding part FP. The $(2-3)^{th}$ extension wiring line EL2-3 may be disposed adjacent to the $(2-1)^{th}$ extension wiring line EL2-1. The $(2-3)^{th}$ extension wiring line EL2-3 may be disposed closer to the openings OP than the $(2-1)^{th}$ extension wiring line EL2-1. The $(2-3)^{th}$ extension wiring line EL2-3 may extend in the first direction DR1, and may be parallel to or substantially parallel to the $(2-1)^{th}$ extension wiring line EL2-1. A length of the $(2-3)^{th}$ extension wiring line EL2-3 in the first direction DR1 may be greater than a length of the $(2-1)^{th}$ extension wiring line EL2-1 in the first direction DR1.

The $(2-4)^{th}$ extension wiring line EL2-4 may be disposed on the first non-folding part NFP1 adjacent to the folding part FP. The $(2-4)^{th}$ extension wiring line EL2-4 may be disposed adjacent to the $(2-2)^{th}$ extension wiring line EL2-2. The $(2-4)^{th}$ extension wiring line EL2-4 may be disposed closer to the openings OP than the $(2-2)^{th}$ extension wiring line EL2-2. The $(2-4)^{th}$ extension wiring line EL2-4 may extend in the first direction DR1, and may be parallel to or substantially parallel to the $(2-2)^{th}$ extension wiring line EL2-2. A length of the $(2-4)^{th}$ extension wiring line EL2-4 in the first direction DR1 may be smaller than a length of the $(2-2)^{th}$ extension wiring line EL2-2 in the first direction DR1.

The $(2-5)^{th}$ extension wiring line EL2-5 may be disposed on the second non-folding part NFP2 adjacent to the folding part FP. The $(2-5)^{th}$ extension wiring line EL2-5 may be disposed adjacent to the $(2-3)^{th}$ extension wiring line EL2-3. The $(2-5)^{th}$ extension wiring line EL2-5 may be disposed closer to the openings OP than the $(2-3)^{th}$ extension wiring line EL2-3. The $(2-5)^{th}$ extension wiring line EL2-5 may extend in the first direction DR1, and may be parallel to or substantially parallel to the $(2-3)^{th}$ extension wiring line EL2-3. A length of the $(2-5)^{th}$ extension wiring line EL2-5 in the first direction DR1 may be smaller than the length of the $(2-3)^{th}$ extension wiring line EL2-3 in the first direction DR1. One side of both sides (e.g., one of opposite sides) of the $(2-5)^{th}$ extension wiring line EL2-5, which are opposite to each other in the first direction DR1, may be connected to the second connector connection wiring line CCL2.

The second connection wiring lines CL2 may be arranged in the non-active area NAA, and may extend in the second direction DR2. As an example, the second connection wiring lines CL2 may be arranged in the non-active area NAA on the upper and lower sides. The second connection wiring lines CL2 may be connected to the second extension wiring lines EL2. For example, the second connection wiring lines CL2 of each of the $(2-1)^{th}$ sensing coils CF2-1 may be connected to both ends (e.g., opposite ends) of the second extension wiring lines EL2.

A length of the second connection wiring lines CL2 may be different from a length of the second extension wiring lines EL2. For example, the second extension wiring lines EL2 may be longer than the second connection wiring lines CL2, but the present disclosure is not limited thereto.

The two pairs of second connection wiring lines CL2 may be arranged in the non-active area NAA. The two pairs of second connection wiring lines CL2 may extend parallel to or substantially parallel to each other in the second direction DR2. Among the two pairs of second connection wiring lines CL2, one pair of second connection wiring lines CL2 may be arranged in the non-active area NAA on the upper side. The other pair of the second connection wiring lines CL2 may be arranged in the non-active area NAA on the lower side.

Each of the two pairs of second connection wiring lines CL2 may include a $(2-1)^{th}$ connection wiring line CL2-1, a $(2-2)^{th}$ connection wiring line CL2-2, a $(2-3)^{th}$ connection wiring line CL2-3, and a $(2-4)^{th}$ connection wiring line CL2-4. The $(2-1)^{th}$ connection wiring line CL2-1 may be disposed on the non-active area NAA on the upper side. The $(2-1)^{th}$ connection wiring line CL2-1 may extend in the second direction DR2. The $(2-1)^{th}$ connection wiring line CL2-1 may extend from the non-active area NAA along the edges of the openings OP.

One side of both sides (e.g., one of opposite sides) of the $(2-1)^{th}$ connection wiring line CL2-1, which are opposite to each other in the second direction DR2, may be connected to the $(2-1)^{th}$ extension wiring line EL2-1. The other side of the $(2-1)^{th}$ connection wiring line CL2-1 may be connected to the $(2-2)^{th}$ extension wiring line EL2-2. The $(2-1)^{th}$ extension wiring line EL2-1 and the $(2-2)^{th}$ extension wiring line EL2-2 may be connected to each other by the $(2-1)^{th}$ connection wiring line CL2-1. The $(2-1)^{th}$ connection wiring line CL2-1 may be disposed above the $(2-1)^{th}$ extension wiring line EL2-1 and the $(2\text{-}2)^{th}$ extension wiring line EL2-2. The one side of both sides (e.g., the one of opposite sides) of the $(2\text{-}1)^{th}$ connection wiring line CL2-1, which are opposite to each other in the second direction DR2, may be defined as a side adjacent to a boundary between the second non-folding part NFP2 and the folding part FP.

The $(2\text{-}2)^{th}$ connection wiring line CL2-2 may be disposed in the non-active area NAA on the lower side. The $(2\text{-}2)^{th}$ connection wiring line CL2-2 may extend in the second direction DR2. The $(2\text{-}2)^{th}$ connection wiring line CL2-2 may extend from the non-active area NAA along the edges of the openings OP. The $(2\text{-}2)^{th}$ connection wiring line CL2-2 may be parallel to or substantially parallel to the $(2\text{-}1)^{th}$ connection wiring line CL2-1.

One side of both sides (e.g., one of opposite sides) of the $(2\text{-}2)^{th}$ connection wiring line CL2-2, which are opposite to each other in the second direction DR2, may be connected to the $(2\text{-}2)^{th}$ extension wiring line EL2-2. The other side of the $(2\text{-}2)^{th}$ connection wiring line CL2-2 may be connected to the $(2\text{-}3)^{th}$ extension wiring line EL2-3. The $(2\text{-}2)^{th}$ extension wiring line EL2-2 and the $(2\text{-}3)^{th}$ extension wiring line EL2-3 may be connected to each other by the $(2\text{-}2)^{th}$ connection wiring line CL2-2. The $(2\text{-}2)^{th}$ connection wiring line CL2-2 may be disposed above the $(2\text{-}2)^{th}$ extension wiring line EL2-2 and the $(2\text{-}3)^{th}$ extension wiring line EL2-3. The one side of both sides (e.g., the one of opposite sides) of the $(2\text{-}2)^{th}$ connection wiring line CL2-2, which are opposite to each other in the second direction DR2, may be defined as a side adjacent to a boundary between the first non-folding part NFP1 and the folding part FP.

The $(2\text{-}3)^{th}$ connection wiring line CL2-3 may be disposed on the non-active area NAA on the upper side. The $(2\text{-}3)^{th}$ connection wiring line CL2-3 may extend in the second direction DR2. The $(2\text{-}3)^{th}$ connection wiring line CL2-3 may extend in the non-active area NAA along the edges of the openings OP.

The $(2\text{-}3)^{th}$ connection wiring line CL2-3 may be disposed adjacent to the $(2\text{-}1)^{th}$ connection wiring line CL2-1. The $(2\text{-}3)^{th}$ connection wiring line CL2-3 may be parallel to or substantially parallel to the $(2\text{-}1)^{th}$ connection wiring line CL2-1. The $(2\text{-}3)^{th}$ connection wiring line CL2-3 may be closer to the active area AA than the $(2\text{-}1)^{th}$ connection wiring line CL2-1.

One side of both sides (e.g., one of opposite sides) of the $(2\text{-}3)^{th}$ connection wiring line CL2-3, which are opposite to each other in the second direction DR2, may be connected to the $(2\text{-}3)^{th}$ extension wiring line EL2-3. The other side of the $(2\text{-}3)^{th}$ connection wiring line CL2-3 may be connected to the $(2\text{-}4)^{th}$ extension wiring line EL2-4. The $(2\text{-}3)^{th}$ extension wiring line EL2-3 and the $(2\text{-}4)^{th}$ extension wiring line EL2-4 may be connected to each other by the $(2\text{-}3)^{th}$ connection wiring line CL2-3. The $(2\text{-}3)^{th}$ connection wiring line CL2-3 may be disposed above the $(2\text{-}3)^{th}$ extension wiring line EL2-3 and the $(2\text{-}4)^{th}$ extension wiring line EL2-4. The one side of both sides (e.g., the one of opposite sides) of the $(2\text{-}3)^{th}$ connection wiring line CL2-3, which are opposite to each other in the second direction DR2, may be defined as a side adjacent to the second non-folding part NFP2 and the folding part FP.

The $(2\text{-}4)^{th}$ connection wiring line CL2-4 may be disposed in the non-active area NAA on the lower side. The $(2\text{-}4)^{th}$ connection wiring line CL2-4 may extend in the second direction DR2. The $(2\text{-}4)^{th}$ connection wiring line CL2-4 may extend in the non-active area NAA along the edges of the openings OP.

The $(2\text{-}4)^{th}$ connection wiring line CL2-4 may be disposed adjacent to the $(2\text{-}2)^{th}$ connection wiring line CL2-2. The $(2\text{-}4)^{th}$ connection wiring line CL2-4 may be parallel to or substantially parallel to the $(2\text{-}2)^{th}$ connection wiring line CL2-2. The $(2\text{-}4)^{th}$ connection wiring line CL2-4 may be closer to the active area AA than the $(2\text{-}2)^{th}$ connection wiring line CL2-2.

One side of both sides (e.g., one of opposite sides) of the $(2\text{-}4)^{th}$ connection wiring line CL2-4, which are opposite to each other in the second direction DR2, may be connected to the $(2\text{-}4)^{th}$ extension wiring line EL2-4. The other side of the $(2\text{-}4)^{th}$ connection wiring line CL2-4 may be connected to the $(2\text{-}5)^{th}$ extension wiring line EL2-5. The $(2\text{-}4)^{th}$ extension wiring line EL2-4 and the $(2\text{-}5)^{th}$ extension wiring line EL2-5 may be connected to each other by the $(2\text{-}4)^{th}$ connection wiring line CL2-4. The $(2\text{-}4)^{th}$ connection wiring line CL2-4 may be disposed above the $(2\text{-}4)^{th}$ extension wiring line EL2-4 and the $(2\text{-}5)^{th}$ extension wiring line EL2-5. One side of both sides (e.g., one of opposite sides) of the $(2\text{-}4)^{th}$ connection wiring line CL2-4, which are opposite to each other in the second direction DR2, may be defined as a side adjacent to the boundary between the first non-folding part NFP1 and the folding part FP.

Referring to FIGS. 10A, 11A, and 11B, the first layer LY1 may further include a first support layer GF1. The first sensing coils RF and the $(2\text{-}1)^{th}$ sensing coils CF2-1 may be arranged on an upper surface or a lower surface of the first support layer GF1.

As an example, the first support layer GF1 may include GFRP. However, the present disclosure is not limited thereto, and the first support layer GF1 may include CFRP or an aramid fiber reinforced plastic (AFRP).

When viewed on a plane (e.g., in a plan view), the first sensing coils RF and the $(2\text{-}1)^{th}$ sensing coil CF2-1 may overlap with each other. The first extension wiring lines EL1 of the first sensing coils RF and the second extension wiring lines EL2 of the $(2\text{-}1)^{th}$ sensing coil CF2-1 may overlap with each other.

As illustrated in FIG. 11A, the first extension wiring lines EL1 may be arranged above the second extension wiring lines EL2. The first extension wiring lines EL1 may be arranged on the upper surface of the first support layer GF1. The second extension wiring lines EL2 may be arranged on the lower surface of the first support layer GF1.

The second connection wiring lines CL2 may be arranged on the same plane as that of the first extension wiring lines EL1. In other words, the second connection wiring lines CL2 may be arranged above the second extension wiring lines EL2. As illustrated in FIG. 11B, the second connection wiring lines CL2 may be arranged on the upper surface of the first support layer GF1. The second connection wiring lines CL2 may be connected to the second extension wiring lines EL2 through the contact hole CH. The second extension wiring lines EL2 may be connected to each other by the second connection wiring lines CL2 to form a loop shape.

Referring to FIG. 12, the second layer LY2 of the digitizer DGT may include a second support layer GF2, a plurality of third connector connection wiring lines CCL3, a plurality of fourth connector connection wiring lines CCL4, the $(2\text{-}2)^{th}$ sensing coil CF2-2, and a plurality of third sensing coils CF3.

The second support layer GF2 may include GFRP. However, the present disclosure is not limited thereto, and the second support layer GF2 may include CFRP or AFRP.

The plurality of third connector connection wiring lines CCL3, the plurality of fourth connector connection wiring lines CCL4, the $(2\text{-}2)^{th}$ sensing coil CF2-2, and the plurality of third sensing coils CF3 may be arranged on an upper surface or a lower surface of the second support layer GF2.

The third connector connection wiring lines CCL3 may be arranged in the non-active area NAA on the right side. The third connector connection wiring lines CCL3 may extend in the second direction DR2, may be arranged along the first direction DR1, and may be connected to the main connector MCP. The third sensing coils CF3 may be connected to the main connector MCP through the third connector connection wiring lines CCL3.

The third sensing coils CF3 may be disposed on the second non-folding part NFP2. The third sensing coils CF3 may extend from the main connector MCP to form a loop shape together with the third connector connection wiring lines CCL3. For example, the third sensing coils CF3 extending from the main connector MCP may extend to the non-active area NAA on the right side and the second non-folding part NFP2, may then extend to the non-active area NAA on the right side again, and may be connected to the third connector connection wiring lines CCL3.

The third sensing coils CF3 may form a plurality of loops. As an example, as illustrated in FIG. 12, one third sensing coil CF3 may form two loops, and may then be connected to the third connector connection wiring line CCL3 again. However, the present disclosure is not limited thereto, and the one third sensing coil CF3 may form one loop or more than two loops.

As an example, some of the third sensing coils CF3 may be illustrated in a loop shape, the loop shape of the other third sensing coils CF3 is omitted, and the other third sensing coils CF3 are illustrated to extend in the first direction DR1 inside the active area AA. However, the present disclosure is not limited thereto, and the other third sensing coils CF3 may extend in a loop shape.

The third sensing coils CF3 may include a plurality of third extension wiring lines EL3 and a plurality of third connection wiring lines CL3. The third extension wiring lines EL3 may be arranged in the second non-folding part NFP2, may extend in the first direction DR1, and may be arranged along the second direction DR2. Hereinafter, for convenience, one third sensing coil CF3 will be described in more detail.

The third sensing coil CF3 may include two pairs of third extension wiring lines EL3, and the two pairs of third extension wiring lines EL3 may extend in the first direction DR1 and may be parallel to or substantially parallel to each other. Among the two pairs of third extension wiring lines EL3, one pair of third extension wiring lines EL3 may be closer to the folding part FP than the other pair of third extension wiring lines EL3.

The third extension wiring lines EL3 may include a $(3\text{-}1)^{th}$ extension wiring line EL3-1, a $(3\text{-}2)^{th}$ extension wiring line EL3-2, a $(3\text{-}3)^{th}$ extension wiring line EL3-3, a $(3\text{-}4)^{th}$ extension wiring line EL3-4, and a $(3\text{-}5)^{th}$ extension wiring line EL3-5. The $(3\text{-}1)^{th}$ extension wiring line EL3-1 may extend in the first direction DR1 on the second non-folding part NFP2. One side of both sides (e.g., one of opposite sides) of the $(3\text{-}1)^{th}$ extension wiring line EL3-1, which are opposite to each other in the first direction DR1, may be connected to the third connector connection wiring line CCL3.

The $(3\text{-}2)^{th}$ extension wiring line EL3-2 may extend in the first direction DR1 on the second non-folding part NFP2. The $(3\text{-}2)^{th}$ extension wiring line EL3-2 may be parallel to or substantially parallel to the $(3\text{-}1)^{th}$ extension wiring line EL3-1.

The $(3\text{-}3)^{th}$ extension wiring line EL3-3 may extend in the first direction DR1 on the second non-folding part NFP2. The $(3\text{-}3)^{th}$ extension wiring line EL3-3 may be disposed to be adjacent to the $(3\text{-}1)^{th}$ extension wiring line EL3-1. The $(3\text{-}3)^{th}$ extension wiring line EL3-3 may be parallel to or substantially parallel to the $(3\text{-}1)^{th}$ extension wiring line EL3-1. The $(3\text{-}1)^{th}$ extension wiring line EL3-1 may be closer to the main connector MCP than the $(3\text{-}3)^{th}$ extension wiring line EL3-3.

The $(3\text{-}4)^{th}$ extension wiring line EL3-4 may extend in the first direction DR1 on the second non-folding part NFP2. The $(3\text{-}4)^{th}$ extension wiring line EL3-4 may be disposed adjacent to the $(3\text{-}2)^{th}$ extension wiring line EL3-2. The $(3\text{-}2)^{th}$ extension wiring line EL3-2 may be closer to the folding part FP than the $(3\text{-}4)^{th}$ extension wiring line EL3-4. The $(3\text{-}4)^{th}$ extension wiring line EL3-4 may be parallel to or substantially parallel to the $(3\text{-}2)^{th}$ extension wiring line EL3-2.

The $(3\text{-}5)^{th}$ extension wiring line EL3-5 may extend in the first direction DR1 on the second non-folding part NFP2. The $(3\text{-}5)^{th}$ extension wiring line EL3-5 may be disposed adjacent to the $(3\text{-}3)^{th}$ extension wiring line EL3-3. The $(3\text{-}3)^{th}$ extension wiring line EL3-3 may be closer to the main connector MCP than the $(3\text{-}5)^{th}$ extension wiring line EL3-5. One side of both sides (e.g., one of opposite sides) of the $(3\text{-}5)^{th}$ extension wiring line EL3-5, which are opposite to each other in the first direction DR1, may be connected to the third connector connection wiring lines CCL3. The one side of the $(3\text{-}5)^{th}$ extension wiring line EL3-5 may be defined as a side facing the $(3\text{-}1)^{th}$ extension wiring line EL3-1.

The third connection wiring lines CL3 may include a $(3\text{-}1)^{th}$ connection wiring line CL3-1, a $(3\text{-}2)^{th}$ connection wiring line CL3-2, a $(3\text{-}3)^{th}$ connection wiring line CL3-3, and a $(3\text{-}4)^{th}$ connection wiring line CL3-4. The $(3\text{-}1)^{th}$ connection wiring line CL3-1 may be disposed in the non-active area NAA on the upper side. The $(3\text{-}1)^{th}$ connection wiring line CL3-1 may extend in the second direction DR2. One side of both sides (e.g., one of opposite sides) of the $(3\text{-}1)^{th}$ connection wiring line CL3-1, which are opposite to each other in the second direction DR2, may be connected to the $(3\text{-}1)^{th}$ extension wiring line EL3-1. The other side of the $(3\text{-}1)^{th}$ connection wiring line CL3-1 may be connected to the $(3\text{-}2)^{th}$ extension wiring line EL3-2. The $(3\text{-}1)^{th}$ extension wiring line EL3-1 and the $(3\text{-}2)^{th}$ extension wiring line EL3-2 may be connected to each other by the $(3\text{-}1)^{th}$ connection wiring line CL3-1.

The $(3\text{-}2)^{th}$ connection wiring line CL3-2 may be disposed in the non-active area NAA on the lower side. The $(3\text{-}2)^{th}$ connection wiring line CL3-2 may extend in the second direction DR2. One side of both sides (e.g., one of opposite sides) of the $(3\text{-}2)^{th}$ connection wiring line CL3-2, which are opposite to each other in the second direction DR2, may be connected to the $(3\text{-}2)^{th}$ extension wiring line EL3-2. The other side of the $(3\text{-}2)^{th}$ connection wiring line CL3-2 may be connected to the $(3\text{-}3)^{th}$ extension wiring line EL3-3. The $(3\text{-}2)^{th}$ extension wiring line EL3-2 and the $(3\text{-}3)^{th}$ extension wiring line EL3-3 may be connected to each other by the $(3\text{-}2)^{th}$ connection wiring line CL3-2. The one side of the $(3\text{-}2)^{th}$ connection wiring line CL3-2 may be defined as a side adjacent to the folding part FP.

The $(3\text{-}3)^{th}$ connection wiring line CL3-3 may be disposed in the non-active area NAA on the upper side. The $(3\text{-}3)^{th}$ connection wiring line CL3-3 may extend in the second direction DR2. The $(3\text{-}3)^{th}$ connection wiring line CL3-3 may be disposed adjacent to the $(3\text{-}1)^{th}$ connection wiring line CL3-1. The $(3\text{-}1)^{th}$ connection wiring line CL3-1 and the $(3\text{-}3)^{th}$ connection wiring line CL3-3 may be parallel to or substantially parallel to each other. The $(3\text{-}3)^{th}$ connection wiring line CL3-3 may be closer to the active area AA than the $(3\text{-}1)^{th}$ connection wiring line CL3-1.

One side of both sides (e.g., one of opposite sides) of the $(3\text{-}3)^{th}$ connection wiring line CL3-3, which are opposite to each other in the second direction DR2, may be connected to the $(3\text{-}3)^{th}$ extension wiring line EL3-3. The other side of the $(3\text{-}3)^{th}$ connection wiring line CL3-3 may be connected to the $(3\text{-}4)^{th}$ extension wiring line EL3-4. The $(3\text{-}3)^{th}$ extension wiring line EL3-3 and the $(3\text{-}4)^{th}$ extension wiring line EL3-4 may be connected to each other by the $(3\text{-}3)^{th}$ connection wiring line CL3-3.

The $(3\text{-}4)^{th}$ connection wiring line CL3-4 may be disposed in the non-active area NAA on the lower side. The $(3\text{-}4)^{th}$ connection wiring line CL3-4 may extend in the second direction DR2. The $(3\text{-}4)^{th}$ connection wiring line CL3-4 may be disposed adjacent to the $(3\text{-}2)^{th}$ connection wiring line CL3-2. The $(3\text{-}2)^{th}$ connection wiring line CL3-2 and the $(3\text{-}4)^{th}$ connection wiring line CL3-4 may be parallel to or substantially parallel to each other. The $(3\text{-}2)^{th}$ connection wiring line CL3-2 may be closer to the active area AA than the $(3\text{-}4)^{th}$ connection wiring line CL3-4.

One side of both sides (e.g., one of opposite sides) of the $(3\text{-}4)^{th}$ connection wiring line CL3-4, which are opposite to each other in the second direction DR2, may be connected to the $(3\text{-}4)^{th}$ extension wiring line EL3-4. The other side of the $(3\text{-}4)^{th}$ connection wiring line CL3-4 may be connected to the $(3\text{-}5)^{th}$ extension wiring line EL3-5. The $(3\text{-}4)^{th}$ extension wiring line EL3-4 and the $(3\text{-}5)^{th}$ extension wiring line EL3-5 may be connected to each other by the $(3\text{-}4)^{th}$ connection wiring line CL3-4.

Because the $(3\text{-}1)^{th}$ to $(3\text{-}5)^{th}$ extension wiring lines EL3-1 to EL3-5, the third connector connection wiring lines CCL3, and the $(3\text{-}1)^{th}$ to $(3\text{-}4)^{th}$ connection wiring lines CL3-1 to CL3-4 are connected to each other, the third sensing coils CF3 may form a plurality of loops. For convenience, the one third sensing coil CF3 has been described in more detail, but the other third sensing coils CF3 may also form the loops in the same or substantially the same manner.

The fourth connector connection wiring lines CCL4 may be arranged in the non-active area NAA on the right side and the active area AA of the second non-folding part NFP2. The fourth connector connection wiring lines CCL4 may extend in the second direction DR2, may be arranged along the first direction DR1, and may be connected to the main connector MCP. The $(2\text{-}2)^{th}$ sensing coil CF2-2 may be connected to the main connector MCP through the fourth connector connection wiring lines CCL4.

The $(2\text{-}2)^{th}$ sensing coil CF2-2 may form a loop shape. The $(2\text{-}2)^{th}$ sensing coil CF2-2 connected to the fourth connector connection wiring lines CCL4 may form a loop shape within the active area AA. When viewed on a plane (e.g., in a plan view), the $(2\text{-}2)^{th}$ sensing coil CF2-2 may overlap with the folding part FP and the second non-folding part NFP2. When viewed on a plane (e.g., in a plan view), a portion of the $(2\text{-}2)^{th}$ sensing coil CF2-2 may be disposed between the openings OP adjacent to each other in the second direction DR2.

The $(2\text{-}2)^{th}$ sensing coil CF2-2 may form a plurality of loop shapes. As an example, referring to FIG. 12, the $(2\text{-}2)^{th}$ sensing coil CF2-2 may form two loop shapes. When viewed on a plane (e.g., in a plan view), the two loops may have different sizes from each other. The $(2\text{-}2)^{th}$ sensing coil CF2-2 may form the two loops, may then be connected to the fourth connector connection wiring line CCL4 again, and may be connected to the main connector MCP. However, the present disclosure is not limited thereto, and the $(2\text{-}2)^{th}$ sensing coil CF2-2 may form one loop shape or more than two loop shapes.

The $(2\text{-}2)^{th}$ sensing coil CF2-2 may include a plurality of fourth extension wiring lines EL4 and a plurality of fourth connection wiring lines CL4. The fourth extension wiring lines EL4 may be arranged in the active area AA, may be arranged along the first direction DR1, may extend in the first direction DR1, and may be arranged along the second direction DR2. As an example, each of the $(2\text{-}2)^{th}$ sensing coils CF2-2 may include two pairs of fourth extension wiring lines EL4, and the two pairs of fourth extension wiring lines EL4 may extend parallel to or substantially parallel to each other in the first direction DR1.

The fourth extension wiring lines EL4 may include a $(4\text{-}1)^{th}$ extension wiring line EL4-1, a $(4\text{-}2)^{th}$ extension wiring line EL4-2, a $(4\text{-}3)^{th}$ extension wiring line EL4-3, a $(4\text{-}4)^{th}$ extension wiring line EL4-4, and a $(4\text{-}5)^{th}$ extension wiring line EL4-5. The $(4\text{-}1)^{th}$ extension wiring line EL4-1 may be disposed on the second non-folding part NFP2. The $(4\text{-}1)^{th}$ extension wiring line EL4-1 may extend in the first direction DR1. One side of both sides (e.g., one of opposite sides) of the $(4\text{-}1)^{th}$ extension wiring line EL4-1, which are opposite to each other in the first direction DR1, may be connected to the fourth connector connection wiring line CCL4.

The $(4\text{-}2)^{th}$ extension wiring line EL4-2 may be disposed on the folding part FP. The $(4\text{-}2)^{th}$ extension wiring line EL4-2 may be disposed between the openings OP that are adjacent to each other in the second direction DR2. The $(4\text{-}2)^{th}$ extension wiring line EL4-2 may extend in the first direction DR1. The $(4\text{-}2)^{th}$ extension wiring line EL4-2 may be parallel to or substantially parallel to the $(4\text{-}1)^{th}$ extension wiring line EL4-1.

The $(4\text{-}3)^{th}$ extension wiring line EL4-3 may be disposed on the second non-folding part NFP2. The $(4\text{-}3)^{th}$ extension wiring line EL4-3 may be disposed adjacent to the $(4\text{-}1)^{th}$ extension wiring line EL4-1. The $(4\text{-}3)^{th}$ extension wiring line EL4-3 may be disposed closer to the openings OP than the $(4\text{-}1)^{th}$ extension wiring line EL4-1. The $(4\text{-}3)^{th}$ extension wiring line EL4-3 may extend in the first direction DR1. The $(4\text{-}1)^{th}$ extension wiring line EL4-1 and the $(4\text{-}3)^{th}$ extension wiring line EL4-3 may be parallel to or substantially parallel to each other.

The $(4\text{-}4)^{th}$ extension wiring line EL4-4 may be disposed on the folding part FP. The $(4\text{-}4)^{th}$ extension wiring line EL4-4 may be disposed between the openings OP that are adjacent to each other in the second direction DR2. The $(4\text{-}4)^{th}$ extension wiring line EL4-4 may be disposed adjacent to the $(4\text{-}2)^{th}$ extension wiring line EL4-2. The $(4\text{-}4)^{th}$ extension wiring line EL4-4 may be disposed closer to the second non-folding part NFP2 than the $(4\text{-}2)^{th}$ extension wiring line EL4-2. The $(4\text{-}4)^{th}$ extension wiring line EL4-4 may extend in the first direction DR1. The $(4\text{-}2)^{th}$ extension wiring line EL4-2 and the $(4\text{-}4)^{th}$ extension wiring line EL4-4 may be parallel to or substantially parallel to each other.

The $(4\text{-}5)^{th}$ extension wiring line EL4-5 may be disposed on the second non-folding part NFP2. The $(4\text{-}5)^{th}$ extension wiring line EL4-5 may be disposed adjacent to the $(4\text{-}3)^{th}$ extension wiring line EL4-3. The $(4\text{-}5)^{th}$ extension wiring line EL4-5 may be disposed closer to the openings OP than the $(4\text{-}3)^{th}$ extension wiring line EL4-3. The $(4\text{-}5)^{th}$ extension wiring line EL4-5 may extend in the first direction DR1, and may be parallel to or substantially parallel to the $(4\text{-}3)^{th}$ extension wiring line EL4-3. A length of the $(4\text{-}5)^{th}$ extension wiring line EL4-5 in the first direction DR1 may be greater than a length of the $(4\text{-}3)^{th}$ extension wiring line EL4-3 in the first direction DR1. One side of both sides (e.g., one of opposite sides) of the $(4\text{-}5)^{th}$ extension wiring line EL4-5, which are opposite to each other in the first direction DR1, may be connected to the fourth connector connection wiring line CCL4. The one side of the $(4\text{-}5)^{th}$ extension wiring line EL4-5 may be defined as a side facing towards the $(4\text{-}1)^{th}$ extension wiring line EL4-1.

The fourth connection wiring lines CL4 may be arranged in the non-active area NAA, and may extend in the second direction DR2. The fourth connection wiring lines CL4 may extend along the edges of the openings OP. As an example, the fourth connection wiring lines CL4 may be arranged in the non-active area NAA on the upper and lower sides. When viewed on a plane (e.g., in a plan view), the fourth connection wiring lines CL4 may overlap with the folding part FP and the second non-folding part NFP2. The fourth connection wiring lines CL4 may be connected to the fourth extension wiring lines EL4. For example, the fourth connection wiring lines CL4 of each of the $(2\text{-}2)^{th}$ sensing coils CF2-2 may be connected to both ends (e.g., opposite ends) of the fourth extension wiring lines EL4.

A length of the fourth connection wiring lines CL4 may be different from a length of the fourth extension wiring lines EL4. For example, the length of the fourth extension wiring lines EL4 may be greater than the length of the fourth connection wiring lines CL4, but the present disclosure is not limited thereto.

Two pairs of fourth connection wiring lines CL4 may be arranged in the non-active area NAA. The two pairs of fourth connection wiring lines CL4 may extend parallel to or substantially parallel to each other in the second direction DR2. Among the two pairs of fourth connection wiring lines CL4, one pair of fourth connection wiring lines CL4 may be arranged in the non-active area NAA on the upper side. The other pair of fourth connection wiring lines CL4 may be arranged in the non-active area NAA on the lower side.

Each of the two pairs of fourth connection wiring lines CL4 may include a $(4\text{-}1)^{th}$ connection wiring line CL4-1, a $(4\text{-}2)^{th}$ connection wiring line CL4-2, a $(4\text{-}3)^{th}$ connection wiring line CL4-3, and a $(4\text{-}4)^{th}$ connection wiring line CL4-4. The $(4\text{-}1)^{th}$ connection wiring line CL4-1 may be disposed on the non-active area NAA on the upper side. The $(4\text{-}1)^{th}$ connection wiring line CL4-1 may extend in the second direction DR2. The $(4\text{-}1)^{th}$ connection wiring line CL4-1 may extend in the non-active area NAA along the edges of the openings OP.

One side of both sides (e.g., one of opposite sides) of the $(4\text{-}1)^{th}$ connection wiring line CL4-1, which are opposite to each other in the second direction DR2, may be connected to the $(4\text{-}1)^{th}$ extension wiring line EL4-1. The other side of the $(4\text{-}1)^{th}$ connection wiring line CL4-1 may be connected to the $(4\text{-}2)^{th}$ extension wiring line EL4-2. The $(4\text{-}1)^{th}$ extension wiring line EL4-1 and the $(4\text{-}2)^{th}$ extension wiring line EL4-2 may be connected to each other by the $(4\text{-}1)^{th}$ connection wiring line CL4-1. The one side of both sides (e.g., the one of opposite sides) of the $(4\text{-}1)^{th}$ connection wiring line CL4-1, which are opposite to each other in the second direction DR2, may be defined as a side adjacent to the boundary between the second non-folding part NFP2 and the folding part FP.

The $(4\text{-}2)^{th}$ connection wiring line CL4-2 may be disposed in the non-active area NAA on the lower side. The $(4\text{-}2)^{th}$ connection wiring line CL4-2 may extend in the second direction DR2. The $(4\text{-}2)^{th}$ connection wiring line CL4-2 may extend in the non-active area NAA along the edges of the openings OP. The $(4\text{-}2)^{th}$ connection wiring line CL4-2 may be parallel to or substantially parallel to the $(4\text{-}1)^{th}$ connection wiring line CL4-1.

One side of both sides (e.g., one of opposite sides) of the $(4\text{-}2)^{th}$ connection wiring line CL4-2, which are opposite to each other in the second direction DR2, may be connected to the $(4\text{-}2)^{th}$ extension wiring line EL4-2. The other side of the $(4\text{-}2)^{th}$ connection wiring line CL4-2 may be connected to the $(4\text{-}3)^{th}$ extension wiring line EL4-3. The $(4\text{-}2)^{th}$ extension wiring line EL4-2 and the $(4\text{-}3)^{th}$ extension wiring line EL4-3 may be connected to each other by the $(4\text{-}2)^{th}$ connection wiring line CL4-2. The one side of both sides (e.g., the one of opposite sides) of the $(4\text{-}2)^{th}$ connection wiring line CL4-2, which are opposite to each other in the second direction DR2, may be defined as a side adjacent to the boundary between the second non-folding part NFP2 and the folding part FP.

The $(4\text{-}3)^{th}$ connection wiring line CL4-3 may be disposed on the non-active area NAA on the upper side. The $(4\text{-}3)^{th}$ connection wiring line CL4-3 may extend in the second direction DR2. The $(4\text{-}3)^{th}$ connection wiring line CL4-3 may extend from the non-active area NAA along the edges of the openings OP.

The $(4\text{-}3)^{th}$ connection wiring line CL4-3 may be disposed adjacent to the $(4\text{-}1)^{th}$ connection wiring line CL4-1. The $(4\text{-}3)^{th}$ connection wiring line CL4-3 may be parallel to or substantially parallel to the $(4\text{-}1)^{th}$ connection wiring line CL4-1. The $(4\text{-}3)^{th}$ connection wiring line CL4-3 may be closer to the active area AA than the $(4\text{-}1)^{th}$ connection wiring line CL4-1.

One side of both sides (e.g., one of opposite sides) of the $(4\text{-}3)^{th}$ connection wiring line CL4-3, which are opposite to each other in the second direction DR2, may be connected to the $(4\text{-}3)^{th}$ extension wiring line EL4-3. The other side of the $(4\text{-}3)^{th}$ connection wiring line CL4-3 may be connected to the $(4\text{-}4)^{th}$ extension wiring line EL4-4. The $(4\text{-}3)^{th}$ extension wiring line EL4-3 and the $(4\text{-}4)^{th}$ extension wiring line EL4-4 may be connected to each other by the $(4\text{-}3)^{th}$ connection wiring line CL4-3. The one side of both sides (e.g., the one of opposite sides) of the $(4\text{-}3)^{th}$ connection wiring line CL4-3, which are opposite to each other in the second direction DR2, may be defined as a side adjacent to the second non-folding part NFP2 and the folding part FP.

The $(4\text{-}4)^{th}$ connection wiring line CL4-4 may be disposed in the non-active area NAA on the lower side. The $(4\text{-}4)^{th}$ connection wiring line CL4-4 may extend in the second direction DR2. The $(4\text{-}4)^{th}$ connection wiring line CL4-4 may extend from the non-active area NAA along the edges of the openings OP.

The $(4\text{-}4)^{th}$ connection wiring line CL4-4 may be disposed adjacent to the $(4\text{-}2)^{th}$ connection wiring line CL4-2. The $(4\text{-}4)^{th}$ connection wiring line CL4-4 may be parallel to or substantially parallel to the $(4\text{-}2)^{th}$ connection wiring line CL4-2. The $(4\text{-}4)^{th}$ connection wiring line CL4-4 may be closer to the active area AA than the $(4\text{-}2)^{th}$ connection wiring line CL4-2.

One side of both sides (e.g., one of opposite sides) of the $(4\text{-}4)^{th}$ connection wiring line CL4-4, which are opposite to each other in the second direction DR2, may be connected to the $(4\text{-}4)^{th}$ extension wiring line EL4-4. The other side of the $(4\text{-}4)^{th}$ connection wiring line CL4-4 may be connected to the $(4\text{-}5)^{th}$ extension wiring line EL4-5. The $(4\text{-}4)^{th}$ extension wiring line EL4-4 and the $(4\text{-}5)^{th}$ extension wiring line EL4-5 may be connected to each other by the $(4\text{-}4)^{th}$ connection wiring line CL4-4. The one side of both sides (e.g., the one of opposite sides) of the $(4\text{-}4)^{th}$ connection wiring line CL4-4, which are opposite to each other in the second direction DR2, may be defined as a side adjacent to the boundary between the first non-folding part NFP1 and the folding part FP.

The fourth extension wiring line EL4, the fourth connector connection wiring lines CCL4, and the fourth connection wiring line CL4 may be connected to each other to form a loop.

When viewed on a plane (e.g., in a plan view), the $(2\text{-}2)^{th}$ sensing coils CF2-2 and the third sensing coils CF3 may cross or intersect each other. The $(2\text{-}2)^{th}$ sensing coils CF2-2 and the third sensing coils CF3 may not be arranged at (e.g., in or on) the same plane as each other. As an example, at a point at which the $(2\text{-}2)^{th}$ sensing coils CF2-2 and the third sensing coils CF3 cross or intersect each other, any one of the $(2\text{-}2)^{th}$ sensing coils CF2-2 and any one of the third sensing coils CF3 may be arranged on the lower surface of the second support layer GF2, and may be connected through the contact hole CH.

Referring to FIG. 13, the third layer LY3 of the digitizer DGT may include a third support layer GF3, a sub-connector SCP, a plurality of fifth connector connection wiring lines CCL5, a plurality of sixth connector connection wiring lines CCL6, the $(2\text{-}3)^{th}$ sensing coil CF2-3, and a plurality of fourth sensing coils CF4.

The third support layer GF3 may include GFRP. However, the present disclosure is not limited thereto, and the third support layer GF3 may include CFRP or AFRP.

The plurality of fifth connector connection wiring lines CCL5, the plurality of sixth connector connection wiring lines CCL6, the $(2\text{-}3)^{th}$ sensing coil CF2-3, and the plurality of fourth sensing coils CF4 may be arranged on an upper surface or lower surface of the third support layer GF3.

The sub-connector SCP may be disposed on one side of the digitizer DGT. As an example, the sub-connector SCP may be disposed in the non-active area NAA on the left side. The sub-connector SCP may be disposed in the first non-folding part NFP1. The sub-connector SCP may be electrically connected to the main connector MCP illustrated in FIG. 10A.

The fifth connector connection wiring lines CCL5 may be arranged in the non-active area NAA on the left side. The fifth connector connection wiring lines CCL5 may extend in the second direction DR2, may be arranged along the first direction DR1, and may be connected to the sub-connector SCP. The fourth sensing coils CF4 may be connected to the sub-connector SCP through the fifth connector connection wiring lines CCL5.

The fourth sensing coils CF4 may be arranged on the first non-folding part NFP1. The fourth sensing coils CF4 may extend from the sub-connector SCP to form a loop shape together with the fifth connector connection wiring lines CCL5. For example, the fourth sensing coils CF4 extending from the sub-connector SCP may extend to the non-active area NAA on the left side and the first non-folding part NFP1, may then extend to the non-active area NAA on the left side again, and may be connected to the fifth connector connection wiring lines CCL5.

The fourth sensing coils CF4 may form a plurality of loops. As an example, referring to FIG. 13, one fourth sensing coil CF4 may form two loops, and may then be connected to the fifth connector connection wiring line CCL5 again. However, the present disclosure is not limited thereto, and the one fourth sensing coil CF4 may form one loop or more than two loops.

As an example, some of the fourth sensing coils CF4 are illustrated as the loop shapes, the loop shapes of the other fourth sensing coils CF4 are omitted, and the other fourth sensing coils CF4 extend only in the first direction DR1 inside the active area AA. However, the present disclosure is not limited thereto, and the other fourth sensing coils CF4 may also extend in the loop shapes.

The fourth sensing coils CF4 may include a plurality of fifth extension wiring lines EL5 and a plurality of fifth connection wiring lines CL5. The fifth extension wiring lines EL5 may be arranged in the first non-folding part NFP1, may extend in the first direction DR1, and may be arranged along the second direction DR2. Hereinafter, for convenience, one fourth sensing coil CF4 will be described in more detail.

The fourth sensing coil CF4 may include two pairs of fifth extension wiring lines EL5, and the two pairs of fifth extension wiring lines EL5 may extend parallel to or substantially parallel to each other in the second direction DR2. Among the two pairs of fifth extension wiring lines EL5, one pair of fifth extension wiring lines EL5 may be closer to the folding part FP than the other pair of fifth extension wiring lines EL5.

The fifth extension wiring lines EL5 may include a $(5\text{-}1)^{th}$ extension wiring line EL5-1, a $(5\text{-}2)^{th}$ extension wiring line EL5-2, a $(5\text{-}3)^{th}$ extension wiring line EL5-3, a $(5\text{-}4)^{th}$ extension wiring line EL5-4, and a $(5\text{-}5)^{th}$ extension wiring line EL5-5. The $(5\text{-}1)^{th}$ extension wiring line EL5-1 may extend in the first direction DR1 on the first non-folding part NFP1. One side of both sides (e.g., one of opposite sides) of the $(5\text{-}1)^{th}$ extension wiring line EL5-1, which are opposite to each other in the first direction DR1, may be connected to the fifth connector connection wiring line CCL5.

The $(5\text{-}2)^{th}$ extension wiring line EL5-2 may extend in the first direction DR1 on the first non-folding part NFP1. The $(5\text{-}2)^{th}$ extension wiring line EL5-2 may be parallel to or substantially parallel to the $(5\text{-}1)^{th}$ extension wiring line EL5-1.

The $(5\text{-}3)^{th}$ extension wiring line EL5-3 may extend in the first direction DR1 on the first non-folding part NFP1. The $(5\text{-}3)^{th}$ extension wiring line EL5-3 may be disposed adjacent to the $(5\text{-}1)^{th}$ extension wiring line EL5-1. The $(5\text{-}3)^{th}$ extension wiring line EL5-3 may be parallel to or substantially parallel to the $(5\text{-}1)^{th}$ extension wiring line EL5-1. The $(5\text{-}1)^{th}$ extension wiring line EL5-1 may be closer to the sub-connector SCP than the $(5\text{-}3)^{th}$ extension wiring line EL5-3.

The $(5\text{-}4)^{th}$ extension wiring line EL5-4 may extend in the first direction DR1 on the first non-folding part NFP1. The $(5\text{-}4)^{th}$ extension wiring line EL5-4 may be disposed adjacent to the $(5\text{-}2)^{th}$ extension wiring line EL5-2. The $(5\text{-}2)^{th}$ extension wiring line EL5-2 may be closer to the folding part FP than the $(5\text{-}4)^{th}$ extension wiring line EL5-4. The $(5\text{-}4)^{th}$ extension wiring line EL5-4 may be parallel to or substantially parallel to the $(5\text{-}2)^{th}$ extension wiring line EL5-2.

The $(5\text{-}5)^{th}$ extension wiring line EL5-5 may extend in the first direction DR1 on the first non-folding part NFP1. The $(5\text{-}5)^{th}$ extension wiring line EL5-5 may be disposed adjacent to the $(5\text{-}3)^{th}$ extension wiring line EL5-3. The $(5\text{-}3)^{th}$ extension wiring line EL5-3 may be closer to the sub-connector SCP than the $(5\text{-}5)^{th}$ extension wiring line EL5-5. One side of both sides (e.g., one of opposite sides) of the $(5\text{-}5)^{th}$ extension wiring line EL5-5, which are opposite to each other in the first direction DR1, may be connected to the fifth connector connection wiring line CCL5. The one side of the $(5\text{-}5)^{th}$ extension wiring line EL5-5 may be defined as a side facing the $(5\text{-}1)^{th}$ extension wiring line EL5-1.

The fifth connection wiring lines CL5 may include a $(5\text{-}1)^{th}$ connection wiring line CL5-1, a $(5\text{-}2)^{th}$ connection wiring line CL5-2, a $(5\text{-}3)^{th}$ connection wiring line CL5-3, and a $(5\text{-}4)^{th}$ connection wiring line CL5-4. The $(5\text{-}1)^{th}$ connection wiring line CL5-1 may be disposed in the non-active area NAA on the upper side. The $(5\text{-}1)^{th}$ connection wiring line CL5-1 may extend in the second direction DR2. One side of both sides (e.g., one of opposite sides) of the $(5\text{-}1)^{th}$ connection wiring line CL5-1, which are opposite to each other in the second direction DR2, may be connected to the $(5\text{-}1)^{th}$ extension wiring line EL5-1. The other side of the $(5\text{-}1)^{th}$ connection wiring line CL5-1 may be connected to the $(5\text{-}2)^{th}$ extension wiring line EL5-2. The $(5\text{-}1)^{th}$ extension wiring line EL5-1 and the $(5\text{-}2)^{th}$ extension wiring line EL5-2 may be connected to each other by the $(5\text{-}1)^{th}$ connection wiring line CL5-1.

The $(5\text{-}2)^{th}$ connection wiring line CL5-2 may be disposed in the non-active area NAA on the lower side. The $(5\text{-}2)^{th}$ connection wiring line CL5-2 may extend in the second direction DR2. One side of both sides (e.g., one of opposite sides) of the $(5\text{-}2)^{th}$ connection wiring line CL5-2, which are opposite to each other in the second direction DR2, may be connected to the $(5\text{-}2)^{th}$ extension wiring line EL5-2. The other side of the $(5\text{-}2)^{th}$ connection wiring line CL5-2 may be connected to the $(5\text{-}3)^{th}$ extension wiring line EL5-3. The $(5\text{-}2)^{th}$ extension wiring line EL5-2 and the $(5\text{-}3)^{th}$ extension wiring line EL5-3 may be connected to each other by the $(5\text{-}2)^{th}$ connection wiring line CL5-2. The one side of the $(5\text{-}2)^{th}$ connection wiring line CL5-2 may be defined as a side adjacent to the folding part FP.

The $(5\text{-}3)^{th}$ connection wiring line CL5-3 may be disposed in the non-active area NAA on the upper side. The $(5\text{-}3)^{th}$ connection wiring line CL5-3 may extend in the second direction DR2. The $(5\text{-}3)^{th}$ connection wiring line CL5-3 may be disposed adjacent to the $(5\text{-}1)^{th}$ connection wiring line CL5-1. The $(5\text{-}1)^{th}$ connection wiring line CL5-1 and the $(5\text{-}3)^{th}$ connection wiring line CL5-3 may be parallel to or substantially parallel to each other. The $(5\text{-}3)^{th}$ connection wiring line CL5-3 may be closer to the active area AA than the $(5\text{-}1)^{th}$ connection wiring line CL5-1.

One side of both sides (e.g., one of opposite sides) of the $(5\text{-}3)^{th}$ connection wiring line CL5-3, which are opposite to each other in the second direction DR2, may be connected to the $(5\text{-}3)^{th}$ extension wiring line EL5-3. The other side of the $(5\text{-}3)^{th}$ connection wiring line CL5-3 may be connected to the $(5\text{-}4)^{th}$ extension wiring line EL5-4. The $(5\text{-}3)^{th}$ extension wiring line EL5-3 and the $(5\text{-}4)^{th}$ extension wiring line EL5-4 may be connected to each other by the $(5\text{-}3)^{th}$ connection wiring line CL5-3.

The $(5\text{-}4)^{th}$ connection wiring line CL5-4 may be disposed in the non-active area NAA on the lower side. The $(5\text{-}4)^{th}$ connection wiring line CL5-4 may extend in the second direction DR2. The $(5\text{-}4)^{th}$ connection wiring line CL5-4 may be disposed adjacent to the $(5\text{-}2)^{th}$ connection wiring line CL5-2. The $(5\text{-}2)^{th}$ connection wiring line CL5-2 and the $(5\text{-}4)^{th}$ connection wiring line CL5-4 may be parallel to or substantially parallel to each other. The $(5\text{-}2)^{th}$ connection wiring line CL5-2 may be closer to the active area AA than the $(5\text{-}4)^{th}$ connection wiring line CL5-4.

One side of both sides (e.g., one of opposite sides) of the $(5\text{-}4)^{th}$ connection wiring line CL5-4, which are opposite to each other in the second direction DR2, may be connected to the $(5\text{-}4)^{th}$ extension wiring line EL5-4. The other side of the $(5\text{-}4)^{th}$ connection wiring line CL5-4 may be connected to the $(5\text{-}5)^{th}$ extension wiring line EL5-5. The $(5\text{-}4)^{th}$ extension wiring line EL5-4 and the $(5\text{-}5)^{th}$ extension wiring line EL5-5 may be connected to each other by the $(5\text{-}4)^{th}$ connection wiring line CL5-4.

Because the $(5\text{-}1)^{th}$ to $(5\text{-}5)^{th}$ extension wiring lines EL5-1 to EL5-5, the fifth connector connection wiring lines CCL5, and the $(5\text{-}1)^{th}$ to $(5\text{-}4)^{th}$ connection wiring lines CL5-1 to CL5-4 are connected to each other, the fourth sensing coils CF4 may form a plurality of loops. As an example, the one fourth sensing coil CF4 has been described in more detail, but the other fourth sensing coils CF4 may form loops in the same or substantially the same manner.

The sixth connector connection wiring lines CCL6 may be arranged in the non-active area NAA on the left side and the active area AA of the first non-folding part NFP1. The sixth connector connection wiring lines CCL6 may extend in the second direction DR2, may be arranged along the first direction DR1, and may be connected to the sub-connector SCP. The $(2\text{-}3)^{th}$ sensing coil CF2-3 may be connected to the sub-connector SCP by the sixth connector connection wiring lines CCL6.

The $(2\text{-}3)^{th}$ sensing coil CF2-3 may form a loop shape. The $(2\text{-}3)^{th}$ sensing coil CF2-3 connected to the sixth connector connection wiring lines CCL6 may form a loop shape within the active area AA. When viewed on a plane (e.g., in a plan view), the $(2\text{-}3)^{th}$ sensing coil CF2-3 may overlap with the folding part FP and the first non-folding part NFP1. When viewed on a plane (e.g., in a plan view), a portion of the $(2\text{-}3)^{th}$ sensing coil CF2-3 may be disposed between the openings OP adjacent to each other in the second direction DR2.

The $(2\text{-}3)^{th}$ sensing coil CF2-3 may form a plurality of loop shapes. As an example, referring to FIG. 13, the $(2\text{-}3)^{th}$ sensing coil CF2-3 may form two loop shapes. When viewed on a plane (e.g., in a plan view), the two loops may have different sizes from each other. The $(2\text{-}3)^{th}$ sensing coil CF2-3 may form two loops, may then be connected to the sixth connector connection wiring line CCL6 again, and may be connected to the sub-connector SCP. However, the present disclosure is not limited thereto, and the $(2\text{-}3)^{th}$ sensing coil CF2-3 may form one loop shape or more than two loop shapes.

The $(2\text{-}3)^{th}$ sensing coil CF2-3 may include a plurality of sixth extension wiring lines EL6 and a plurality of sixth connection wiring lines CL6. The sixth extension wiring lines EL6 may be arranged in the active area AA, may be arranged along the first direction DR1, may extend in the first direction DR1, and may be arranged along the second direction DR2. As an example, the $(2\text{-}3)^{th}$ sensing coil CF2-3 may include two pairs of sixth extension wiring lines EL6, and the two pair of sixth extension wiring lines EL6 may extend parallel to or substantially parallel to each other in the first direction DR1.

The sixth extension wiring lines EL6 may include a $(6\text{-}1)^{th}$ extension wiring line EL6-1, a $(6\text{-}2)^{th}$ extension wiring line EL6-2, a $(6\text{-}3)^{th}$ extension wiring line EL6-3, a $(6\text{-}4)^{th}$ extension wiring line EL6-4, and a $(6\text{-}5)^{th}$ extension wiring line EL6-5. The $(6\text{-}1)^{th}$ extension wiring line EL6-1 may be disposed on the first non-folding part NFP1. The $(6\text{-}1)^{th}$ extension wiring line EL6-1 may extend in the first direction DR1. One side of both sides (e.g., one of opposite sides) of the $(6\text{-}1)^{th}$ extension wiring line EL6-1, which are opposite to each other in the first direction DR1, may be connected to the sixth connector connection wiring line CCL6.

The $(6\text{-}2)^{th}$ extension wiring line EL6-2 may be disposed on the folding part FP. The $(6\text{-}2)^{th}$ extension wiring line EL6-2 may be disposed between the openings OP that are adjacent to each other in the second direction DR2. The $(6\text{-}2)^{th}$ extension wiring line EL6-2 may extend in the first direction DR1. The $(6-2)^{th}$ extension wiring line EL6-2 may be parallel to or substantially parallel to the $(6-1)^{th}$ extension wiring line EL6-1.

The $(6-3)^{th}$ extension wiring line EL6-3 may be disposed on the first non-folding part NFP1. The $(6-3)^{th}$ extension wiring line EL6-3 may be disposed adjacent to the $(6-1)^{th}$ extension wiring line EL6-1. The $(6-3)^{th}$ extension wiring line EL6-3 may be disposed closer to the openings OP than the $(6-1)^{th}$ extension wiring line EL6-1. The $(6-3)^{th}$ extension wiring line EL6-3 may extend in the first direction DR1. The $(6-1)^{th}$ extension wiring line EL6-1 and the $(6-3)^{th}$ extension wiring line EL6-3 may be parallel to or substantially parallel to each other.

The $(6-4)^{th}$ extension wiring line EL6-4 may be disposed on the folding part FP. The $(6-4)^{th}$ extension wiring line EL6-4 may be disposed between the openings OP that are adjacent to each other in the second direction DR2. The $(6-4)^{th}$ extension wiring line EL6-4 may be disposed adjacent to the $(6-2)^{th}$ extension wiring line EL6-2. The $(6-4)^{th}$ extension wiring line EL6-4 may be disposed closer to the first non-folding part NFP1 than the $(6-2)^{th}$ extension wiring line EL6-2. The $(6-4)^{th}$ extension wiring line EL6-4 may extend in the first direction DR1. The $(6-2)^{th}$ extension wiring line EL6-2 and the $(6-4)^{th}$ extension wiring line EL6-4 may be parallel to or substantially parallel to each other.

The $(6-5)^{th}$ extension wiring line EL6-5 may be disposed on the first non-folding part NFP1. The $(6-5)^{th}$ extension wiring line EL6-5 may be disposed adjacent to the $(6-3)^{th}$ extension wiring line EL6-3. The $(6-5)^{th}$ extension wiring line EL6-5 may be disposed closer to the openings OP than the $(6-3)^{th}$ extension wiring line EL6-3. The $(6-5)^{th}$ extension wiring line EL6-5 may extend in the first direction DR1, and may be parallel to or substantially parallel to the $(6-3)^{th}$ extension wiring line EL6-3. A length of the $(6-5)^{th}$ extension wiring line EL6-5 in the first direction DR1 may be greater than a length of the $(6-3)^{th}$ extension wiring line EL6-3 in the first direction DR1. One side of both sides (e.g., one of opposite sides) of the $(6-5)^{th}$ extension wiring line EL6-5, which are opposite to each other in the first direction DR1, may be connected to the sixth connector connection wiring line CCL6. The one side of the $(6-5)^{th}$ extension wiring line EL6-5 may be defined as a side facing the $(6-1)^{th}$ extension wiring line EL6-1.

The sixth connection wiring lines CL6 may be arranged in the non-active area NAA, and may extend in the second direction DR2. The sixth connection wiring lines CL6 may extend along the edges of the openings OP. As an example, the sixth connection wiring lines CL6 may be arranged in the non-active area NAA on the upper and lower sides. When viewed on a plane (e.g., in a plan view), the sixth connection wiring lines CL6 may overlap with the folding part FP and the first non-folding part NFP1. The sixth connection wiring lines CL6 may be connected to the sixth extension wiring lines EL6. For example, the sixth connection wiring lines CL6 of the $(2-3)^{th}$ sensing coil CF2-3 may be connected to both ends (e.g., opposite ends) of the sixth extension wiring lines EL6.

A length of the sixth connection wiring lines CL6 may be different from a length of the sixth extension wiring lines EL6. For example, the length of the sixth extension wiring lines EL6 may be greater than the length of the sixth connection wiring lines CL6, but the present disclosure is not limited thereto.

Two pairs of sixth connection wiring lines CL6 may be arranged in the non-active area NAA. The two pairs of sixth connection wiring lines CL6 may extend parallel to or substantially parallel to each other in the second direction DR2. Among the two pairs of sixth connection wiring lines CL6, one pair of sixth connection wiring lines CL6 may be arranged in the non-active area NAA on the upper side. The other pair of sixth connection wiring lines CL6 may be arranged in the non-active area NAA on the lower side.

Each of the two pairs of sixth connection wiring lines CL6 may include a $(6-1)^{th}$ connection wiring line CL6-1, a $(6-2)^{th}$ connection wiring line CL6-2, a $(6-3)^{th}$ connection wiring line CL6-3, and a $(6-4)^{th}$ connection wiring line CL6-4. The $(6-1)^{th}$ connection wiring line CL6-1 may be disposed on the non-active area NAA on the upper side. The $(6-1)^{th}$ connection wiring line CL6-1 may extend in the second direction DR2. The $(6-1)^{th}$ connection wiring line CL6-1 may extend in the non-active area NAA along the edges of the openings OP.

One side of both sides (e.g., one of opposite sides) of the $(6-1)^{th}$ connection wiring line CL6-1, which are opposite to each other in the second direction DR2, may be connected to the $(6-1)^{th}$ extension wiring line EL6-1. The other side of the $(6-1)^{th}$ connection wiring line CL6-1 may be connected to the $(6-2)^{th}$ extension wiring line EL6-2. The $(6-1)^{th}$ extension wiring line EL6-1 and the $(6-2)^{th}$ extension wiring line EL6-2 may be connected to each other by the $(6-1)^{th}$ connection wiring line CL6-1. One side of both sides (e.g., one of opposite sides) of the $(6-1)^{th}$ connection wiring line CL6-1, which are opposite to each other in the second direction DR2, may be defined as a side opposite to the other side that is adjacent to the boundary between the first non-folding part NFP1 and the folding part FP.

The $(6-2)^{th}$ connection wiring line CL6-2 may be disposed in the non-active area NAA on the lower side. The $(6-2)^{th}$ connection wiring line CL6-2 may extend in the second direction DR2. The $(6-2)^{th}$ connection wiring line CL6-2 may extend from the non-active area NAA along the edges of the openings OP. The $(6-2)^{th}$ connection wiring line CL6-2 may be parallel to or substantially parallel to the $(6-1)^{th}$ connection wiring line CL6-1.

One side of both sides (e.g., one of opposite sides) of the $(6-2)^{th}$ connection wiring line CL6-2, which are opposite to each other in the second direction DR2, may be connected to the $(6-2)^{th}$ extension wiring line EL6-2. The other side of the $(6-2)^{th}$ connection wiring line CL6-2 may be connected to the $(6-3)^{th}$ extension wiring line EL6-3. The $(6-2)^{th}$ extension wiring line EL6-2 and the $(6-3)^{th}$ extension wiring line EL6-3 may be connected to each other by the $(6-2)^{th}$ connection wiring line CL6-2. One side of both sides (e.g., one of opposite sides) of the $(6-2)^{th}$ connection wiring line CL6-2, which are opposite to each other in the second direction DR2, may be defined as a side adjacent to the boundary between the first non-folding part NFP1 and the folding part FP.

The $(6-3)^{th}$ connection wiring line CL6-3 may be disposed on the non-active area NAA on the upper side. The $(6-3)^{th}$ connection wiring line CL6-3 may extend in the second direction DR2. The $(6-3)^{th}$ connection wiring line CL6-3 may extend from the non-active area NAA along the edges of the openings OP.

The $(6-3)^{th}$ connection wiring line CL6-3 may be disposed adjacent to the $(6-1)^{th}$ connection wiring line CL6-1. The $(6-3)^{th}$ connection wiring line CL6-3 may be parallel to or substantially parallel to the $(6-1)^{th}$ connection wiring line CL6-1. The $(6-3)^{th}$ connection wiring line CL6-3 may be closer to the active area AA than the $(6-1)^{th}$ connection wiring line CL6-1.

One side of both sides (e.g., one of opposite sides) of the $(6-3)^{th}$ connection wiring line CL6-3, which are opposite to each other in the second direction DR2, may be connected to the $(6-3)^{th}$ extension wiring line EL6-3. The other side of the $(6-3)^{th}$ connection wiring line CL6-3 may be connected to the $(6-4)^{th}$ extension wiring line EL6-4. The $(6-3)^{th}$ extension wiring line EL6-3 and the $(6-4)^{th}$ extension wiring line EL6-4 may be connected to each other by the $(6-3)^{th}$ connection wiring line CL6-3. One side of both sides (e.g., one of opposite sides) of the $(6-3)^{th}$ connection wiring line CL6-3, which are opposite to each other in the second direction DR2, may be defined as a side opposite to the other side that is adjacent to the first non-folding part NFP1 and the folding part FP.

The $(6-4)^{th}$ connection wiring line CL6-4 may be disposed in the non-active area NAA on the lower side. The $(6-4)^{th}$ connection wiring line CL6-4 may extend in the second direction DR2. The $(6-4)^{th}$ connection wiring line CL6-4 may extend from the non-active area NAA along the edges of the openings OP.

The $(6-4)^{th}$ connection wiring line CL6-4 may be disposed adjacent to the $(6-2)^{th}$ connection wiring line CL6-2. The $(6-4)^{th}$ connection wiring line CL6-4 may be parallel to or substantially parallel to the $(6-2)^{th}$ connection wiring line CL6-2. The $(6-4)^{th}$ connection wiring line CL6-4 may be closer to the active area AA than the $(6-2)^{th}$ connection wiring line CL6-2.

One side of both sides (e.g., one of opposite sides) of the $(6-4)^{th}$ connection wiring line CL6-4, which are opposite to each other in the second direction DR2, may be connected to the $(6-4)^{th}$ extension wiring line EL6-4. The other side of the $(6-4)^{th}$ connection wiring line CL6-4 may be connected to the $(6-5)^{th}$ extension wiring line EL6-5. The $(6-4)^{th}$ extension wiring line EL6-4 and the $(6-5)^{th}$ extension wiring line EL6-5 may be connected to each other by the $(6-4)^{th}$ connection wiring line CL6-4. One side of both sides (e.g., one of opposite sides) of the $(6-4)^{th}$ connection wiring line CL6-4, which are opposite to each other in the second direction DR2, may be defined as a side adjacent to the boundary between the first non-folding part NFP1 and the folding part FP.

The sixth extension wiring line EL6, the sixth connector connection wiring lines CCL6, and the sixth connection wiring line CL6 may be connected to each other to form loops.

When viewed on a plane (e.g., in a plan view), the $(2-3)^{th}$ sensing coils CF2-3 and the fourth sensing coils CF4 may cross or intersect each other. The $(2-3)^{th}$ sensing coils CF2-3 and the fourth sensing coils CF4 may not be arranged at (e.g., in or on) the same plane as each other. As an example, at a point at which the $(2-3)^{th}$ sensing coils CF2-3 and the fourth sensing coils CF4 cross or intersect each other, any one of the $(2-3)^{th}$ sensing coils CF2-3 and any one of the fourth sensing coils CF4 may be arranged on a lower surface of the third support layer GF3, and may be connected through the contact hole CH.

Referring to FIGS. 10A to 13, according to one or more embodiments of the present disclosure, the first sensing coils RF, the second sensing coils CF2-1, CF2-2, and CF2-3, the third sensing coils CF3, and the fourth sensing coils CF4 may be arranged at (e.g., in or on) the first to third layers LY1, LY2, and LY3.

The first sensing coils RF, the second sensing coils CF2-1, CF2-2, and CF2-3, the third sensing coil CF3, and the fourth sensing coil CF4 are arranged in different layers from one another. As an example, the first sensing coil RF may be disposed on the uppermost layer, and the $(2-3)^{th}$ sensing coil CF2-3 may be disposed under the first sensing coil RF. The $(2-2)^{th}$ sensing coil CF2-2 may be disposed under the $(2-3)^{th}$ sensing coil CF2-3 so as not to cross or intersect the $(2-3)^{th}$ sensing coil CF2-3. The third sensing coil CF3, the fourth sensing coil CF4, and the $(2-1)^{th}$ sensing coil CF2-1 may be arranged under the $(2-3)^{th}$ sensing coil CF2-3. In other words, the first sensing coils RF, the second sensing coils CF2-1, CF2-2, and CF2-3, the third sensing coil CF3, and the fourth sensing coil CF4 may be arranged at (e.g., in or on) different layers from one another.

When the first sensing coils RF, the second sensing coils CF2-1, CF2-2, and CF2-3, the third sensing coil CF3, and the fourth sensing coil CF4 are arranged at (e.g., in or on) four different layers, a thickness of the digitizer DGT (e.g., see FIG. 9) may increase. When the thickness of the digitizer DGT increases, and the folding area FA of the display device DD (e.g., see FIG. 1) is folded, a compressive stress may be applied to an upper surface of the digitizer DGT, or a tensile stress may be applied to a lower surface of the digitizer DGT. Accordingly, cracks may occur in the digitizer DGT. Thus, the folding reliability of the display device DD may be degraded.

However, the first sensing coils RF and the $(2-1)^{th}$ sensing coil CF2-1 may be arranged at (e.g., in or on) the first layer LY1, the $(2-2)^{th}$ sensing coil CF2-2 and the third sensing coils CF3 may be arranged at (e.g., in or on) the second layer LY2, and the $(2-3)^{th}$ sensing coil CF2-3 and the fourth sensing coils CF4 may be arranged at (e.g., in or on) the third layer LY3, so that the plurality of sensing coils RF, CF2-1, CF2-2, CF2-3, CF3, and CF4 may be prevented or substantially prevented from electrically interfering with each other. The digitizer DGT (e.g., see FIG. 9) may include the main connector MCP and the sub-connector SCP. The $(2-3)^{th}$ sensing coil CF2-3 and the fourth sensing coil CF4 arranged at (e.g., in or on) the third layer LY3 may be connected to the sub-connector SCP. The first sensing coil RF, the $(2-1)^{th}$ sensing coil CF2-1, the $(2-2)^{th}$ sensing coil CF2-2, and the third sensing coil CF3 may be connected to the main connector MCP. The plurality of sensing coils RF, CF2-1, CF2-2, CF2-3, CF3, and CF4 may be arranged at (e.g., in or on) the first to third layers LY1, LY2, and LY3 so as not to electrically interfere with each other. Accordingly, the thickness of the digitizer DGT (e.g., see FIG. 9) decreases, and thus, when the display device DD (e.g., see FIG. 1) is folded, the magnitudes of the tensile stress and the compressive stress applied to the digitizer DGT may decrease. Thus, a possibility of an occurrence of the cracks in the digitizer DGT may decrease, and the folding reliability of the display device DD may be improved.

Further, the first sensing coils RF, the second sensing coils CF2-1, CF2-2, and CF2-3, the third sensing coil CF3, and the fourth sensing coil CF4 of the digitizer DGT may be arranged at (e.g., in or on) the three layers LY1, LY2, and LY3, and thus, process operations may be reduced as when compared to a case in which the first sensing coils RF, the second sensing coils CF2-1, CF2-2, and CF2-3, the third sensing coil CF3, and the fourth sensing coil CF4 are arranged at (e.g., in or on) four different layers. Thus, the digitizer DGT may be more easily manufactured.

According to some embodiments of the present disclosure, a digitizer may be divided into a first non-folding part, a folding part, and a second non-folding part. The digitizer may include a first sensing coil, a second sensing coil, a third sensing coil, and a fourth sensing coil. The first to fourth sensing coils may be laminated in three layers, and thus, a thickness of the digitizer may be decreased. Accordingly, when a display device is folded, a possibility of an occurrence of cracks in the digitizer may be decreased. Thus, the folding reliability of the display device may be improved.

According to some embodiments of the present disclosure, as the sensing coils of the digitizer may be laminated in three layers, process operations may be reduced. Thus, the digitizer may be more easily manufactured.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a display panel comprising a first non-folding area, a folding area, and a second non-folding area along a first direction; and
a digitizer under the display panel, and having an active area and a non-active area around the active area, the digitizer comprising:
a first sensing coil in the active area;
a second sensing coil in the active area, the second sensing coil having a loop shape surrounding around and overlapping with the folding area;
a third sensing coil under the first sensing coil, and overlapping with the second non-folding area; and
a fourth sensing coil under the third sensing coil, and overlapping with the first non-folding area,
wherein the third sensing coil and the fourth sensing coil do not overlap with each other in a plan view.

2. A display device comprising:
a display panel comprising a first non-folding area, a folding area, and a second non-folding area along a first direction; and
a digitizer under the display panel, and having an active area and a non-active area around the active area, the digitizer comprising:
a first sensing coil in the active area;
a second sensing coil in the active area, and overlapping with the folding area;
a third sensing coil under the first sensing coil, and overlapping with the second non-folding area; and
a fourth sensing coil under the third sensing coil, and overlapping with the first non-folding area,
wherein the third sensing coil and the fourth sensing coil do not overlap with each other in a plan view, and
wherein the second sensing coil comprises:
a $(2-1)^{th}$ sensing coil at the same layer as that of the first sensing coil;
a $(2-2)^{th}$ sensing coil at the same layer as that of the third sensing coil; and a $(2-3)^{th}$ sensing coil at the same layer as that of the fourth sensing coil.

3. The display device of claim 2, wherein the digitizer further comprises:
a main connector on the non-active area adjacent to the second non-folding area; and
a sub-connector on the non-active area adjacent to the first non-folding area, and electrically connected to the main connector.

4. The display device of claim 3, wherein the first sensing coil, the $(2-1)^{th}$ sensing coil, the $(2-2)^{th}$ sensing coil, and the third sensing coil are connected to the main connector, and wherein the $(2-3)^{th}$ sensing coil and the fourth sensing coil are connected to the sub-connector.

5. The display device of claim 4, wherein the digitizer comprises a plurality of connector connection wiring lines connected to the main connector or the sub-connector,
wherein the first sensing coil, the $(2-1)^{th}$ sensing coil, the $(2-2)^{th}$ sensing coil, and the third sensing coil are connected to the main connector through some of the connector connection wiring lines, and
wherein the $(2-3)^{th}$ sensing coil and the fourth sensing coil are connected to the sub-connector through others of the connector connection wiring lines.

6. The display device of claim 2, wherein the $(2-1)^{th}$ sensing coil overlaps with the first non-folding area, the folding area, and the second non-folding area,
wherein the $(2-2)^{th}$ sensing coil overlaps with the folding area and the second non-folding area, and
wherein the $(2-3)^{th}$ sensing coil overlaps with the folding area and the first non-folding area.

7. The display device of claim 6, wherein the $(2-1)^{th}$ sensing coil, the $(2-2)^{th}$ sensing coil, and the $(2-3)^{th}$ sensing coil comprise:
a plurality of extension wiring lines extending in the first direction; and
a plurality of connection wiring lines extending in a second direction crossing the first direction, and connecting the extension wiring lines to one another.

8. The display device of claim 7, wherein the extension wiring lines and the connection wiring lines of each of the $(2-1)^{th}$ sensing coil, the $(2-2)^{th}$ sensing coil, and the $(2-3)^{th}$ sensing coil form a loop shape.

9. The display device of claim 7, wherein a portion of the digitizer overlapping with the folding area has a plurality of openings, and the connection wiring lines extend along edges of the openings.

10. The display device of claim 7, wherein a length of the extension wiring lines is greater than a length of the connection wiring lines.

11. The display device of claim 2, wherein the $(2-2)^{th}$ sensing coil overlaps with the folding area and the second non-folding area.

12. The display device of claim 2, wherein the $(2-3)^{th}$ sensing coil overlaps with the folding area and the first non-folding area.

13. The display device of claim 2, wherein, in a plan view, the $(2-1)^{th}$ sensing coil crosses the first sensing coil, the $(2-2)^{th}$ sensing coil crosses the third sensing coil, and the $(2-3)^{th}$ sensing coil crosses the fourth sensing coil.

14. A display device comprising:
a display panel; and
a digitizer under the display panel, and having a first non-folding part, a folding part, and a second non-folding part along a first direction, the digitizer comprising:
a plurality of sensing coils;

a sub-connector adjacent to the first non-folding part; and a main connector adjacent to the second non-folding part, and at an opposite side from that of the sub-connector in a plan view, wherein some of the sensing coils are connected to any one of the sub-connector, and other of the sensing coils are connected to the main connector.

15. The display device of claim 14, wherein the digitizer comprises a first layer, a second layer, and a third layer sequentially from top to bottom, wherein the sensing coils at the first layer and the second layer are connected to the main connector, and wherein the sensing coils at the third layer are connected to the sub-connector.

16. The display device of claim 15, wherein the sensing coils comprise:

a first sensing coil at the first layer;

a second sensing coil at the first layer, the second layer, and the third layer, and overlapping with the folding part;

a third sensing coil at the second layer, and located in the second non-folding part; and a fourth sensing coil at the third layer, and located in the first non-folding part.

17. The display device of claim 16, wherein, in a plan view, the third sensing coil and the fourth sensing coil do not overlap with each other.

18. The display device of claim 16, wherein the second sensing coil comprises:

a $(2\text{-}1)^{th}$ sensing coil at the first layer;

a $(2\text{-}2)^{th}$ sensing coil at the second layer; and a $(2\text{-}3)^{th}$ sensing coil at the third layer, and wherein, in a plan view, a portion of the $(2\text{-}2)^{th}$ sensing coil and a portion of the $(2\text{-}3)^{th}$ sensing coil overlap with each other.

19. The display device of claim 18, wherein the $(2\text{-}1)^{th}$ sensing coil overlaps with the first non-folding part, the folding part, and the second non-folding part, wherein the $(2\text{-}2)^{th}$ sensing coil overlaps with the second non-folding part and the folding part, and wherein the $(2\text{-}3)^{th}$ sensing coil overlaps with the first non-folding part and the folding part.

20. The display device of claim 14, wherein the main connector and the sub-connector are electrically connected to each other.

* * * * *